United States Patent [19]

Roberts

[11] Patent Number: 5,047,117

[45] Date of Patent: Sep. 10, 1991

[54] METHOD OF FORMING A NARROW SELF-ALIGNED, ANNULAR OPENING IN A MASKING LAYER

[75] Inventor: Martin C. Roberts, Boise, Id.

[73] Assignee: Micron Technology, Inc., Boise, Id.

[21] Appl. No.: 588,639

[22] Filed: Sep. 26, 1990

[51] Int. Cl.[5] .................... H01L 21/306; B44C 1/22; C03C 15/00; C03C 25/06

[52] U.S. Cl. .................. 156/643; 156/648; 156/653; 156/657; 156/659.1; 156/662; 437/72; 437/228

[58] Field of Search ............ 156/643, 644, 646, 647, 156/648, 653, 655, 657, 659.1, 661.1, 662; 427/38, 39; 357/47, 49, 55, 59; 204/192.32, 192.37; 437/61, 62, 65, 67, 72, 78, 228, 233

[56] References Cited

U.S. PATENT DOCUMENTS

| | | | |
|---|---|---|---|
| 3,962,717 | 6/1976 | O'Brien | 357/44 |
| 4,255,207 | 3/1981 | Nicolay et al. | 156/647 X |
| 4,269,636 | 5/1981 | Rivoli et al. | 156/647 X |
| 4,502,914 | 3/1985 | Trumpp et al. | 156/643 |
| 4,598,461 | 7/1986 | Love | 357/23.4 X |
| 4,657,630 | 4/1987 | Agatsuma | 156/643 |

Primary Examiner—William A. Powell
Attorney, Agent, or Firm—Susan B. Collier; Albert M. Crowder; Stanley N. Protigal, Jr.

[57] ABSTRACT

A process for forming within a masking layer a self-aligned annular opening having a width that is substantially narrower than the space width that can be created directly using the maximum resolution of available photolithography. The process involves the following steps: creation of a mask island using conventional photomasking and etching techniques, the perimeter of said island defining the inner perimeter of the perimetric annular opening; blanket deposition of a spacer layer, the thickness of which is equal to the desired width of the annular opening; a blanket deposition of a thick protective layer that is independently etchable over the spacer layer; planarization of the protection layer to or below the top of the spacer layer; and isotropically etching the exposed spacer layer to form a narrow annular opening exposing the substrate. At this point the exposed substrate may be trenched in order to isolate the area definedd by the island, or it may be fabricated in some other configuration. This method of forming an annular opening within a mask region results in a narrow annular opening that is self-aligned with the mask island and the non-etched spacer layer. Subsequent trench fabrication has the self-alignment features of the narrow annular opening. Both the position and width of the narrow annular opening, and therefore the trench, are highly predictable and the method requires minimum masking steps. The narrowness of the annular opening also maximizes die space.

22 Claims, 23 Drawing Sheets

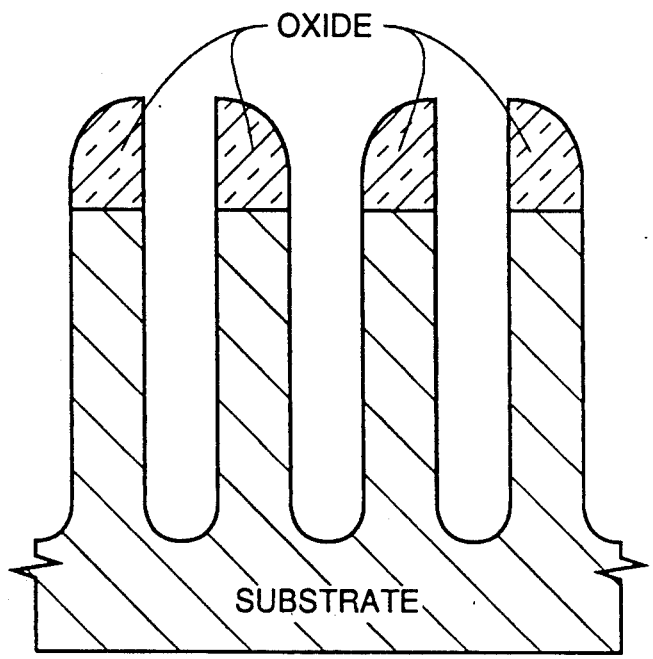
FIG. 3
(PRIOR ART)
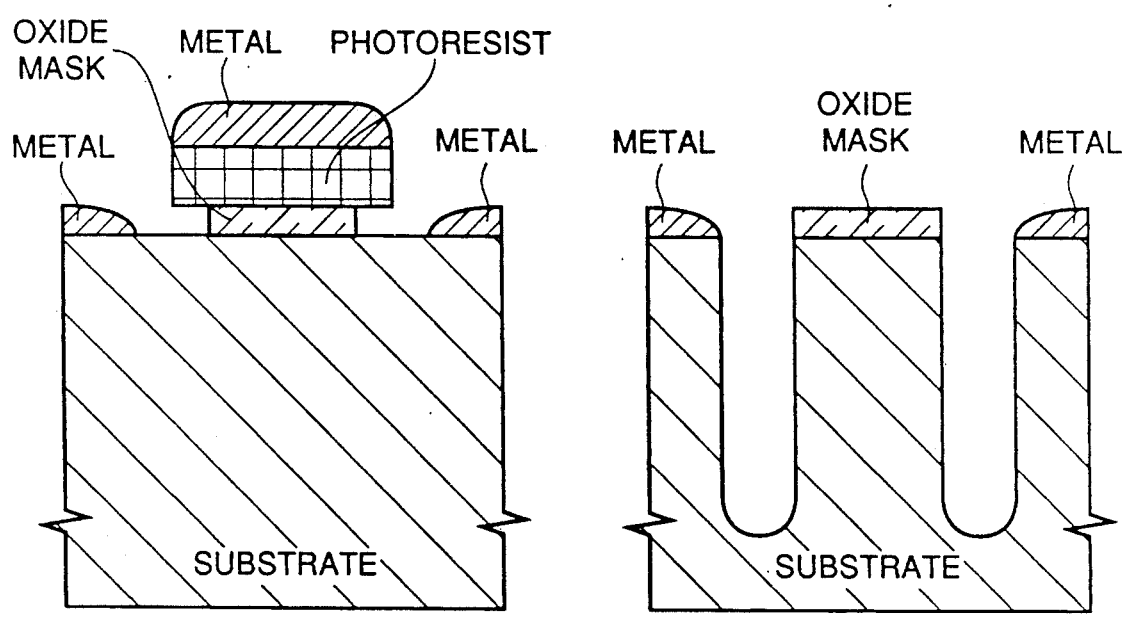
FIG. 4a
(PRIOR ART)
FIG. 4B
(PRIOR ART)

METHOD OF FORMING A NARROW SELF-ALIGNED, ANNULAR OPENING IN A MASKING LAYER

FIELD OF THE INVENTION

This invention relates to semiconductor manufacturing technology and, more particularly, to photolithography masking techniques used to provide feature dimensions which transcend the resolution limits of available photolithography.

BACKGROUND OF THE INVENTION

Since the late 1960's, a new generation of integrated circuits has been developed approximately every four years. Each generation has been characterized by a halving of device dimensions, resulting in a four-fold density increase over the preceding generation. Increases in circuit density have been consistently limited by the resolution of the available photolithographic equipment. The minimum size of features and spaces that a given piece of photolithographic equipment can produce is directly related to its resolution capability It has long been recognized, by those skilled in the fabrication of integrated circuits, that vertical film layers as thin as 0.01 $\mu$ can be grown with a high degree of accuracy Also, layers as thin as 0.1 $\mu$ can be deposited by low pressure chemical vapor deposition, hereinafter known as LPCVD. By comparison, the minimum feature size, producible with the present generation of photolithography equipment used to produce 1-megabit SRAMs and 4-megabit DRAMs, is approximately 0.6 $\mu$. If deposition layers can be used to define horizontal dimensions within integrated circuits, the result will be increased circuit density.

Many die are typically fabricated on a singular semiconductor wafer. Complex circuitries are created on each die. Because of increasing device density on die, it is necessary to enhance the isolation of the different devices to ensure that no current flows through the substrate from one device to another. In FIG. 1, two active areas are isolated from each other by a field oxide region that has been thermally grown using a standard Locos process. During field oxide growth, patches of silicon nitride protect future active areas from oxidation. Electrical devices (e.g., transistors, resistors, capacitors) will ultimately be fabricated in the active areas. The oxide layer must be of relatively large width to ensure that there is no leakage current from one area to another. This leakage current is the result of what is termed bipolar latch up in the case where the two regions are of opposite types; that is, one is n type and the other is p type. Similar regions are also susceptible to leakage current.

In order to reduce the horizontal width of the oxide layer and maximize die space, trenches have been created via several processes. The trenches, filled with an insulative material such as silicon dioxide, extend into the substrate and act as insulating walls between active areas. Because trenches extend into the substrate, they can prevent bipolar latch up even though they may be narrower than the field oxide region of FIG. 1. In fact, the width can now be as narrow as present technology allows. FIG. 2 shows a trench manufactured with polysilicon deposited over an oxide region. The trench width is difficult to precisely predict when using this method due to variations in the polysilicon deposition. FIG. 3 depicts trench fabrication using an oxide mask created with a pitch doubling process that is the subject of a copending U.S. patent application submitted by Tyler Lowrey and Randal Chance of Micron Technolog,y, Inc. and accorded Ser. No. 519,992, filed 5/7/90, entitled "Method for Reducing, by a Factor of $2^{-N}$, the Minimum Masking Pitch for a Photolithographic Process Used in the Fabrication of an Integrated Circuit." In FIG. 4A an oxide mask is formed by under-etching the photoresist. Next, metal is sputtered onto the wafer. The photoresist shields a portion of the substrate next to the oxide mask from the metal. After the wafer has been sputtered, the metal covering the photoresist is lifted and the photoresist is etched producing a mask of metal and oxide for trench formation, FIG. 4B. There is a percentage of error in the predictability of trench size due to the nature of the sputtering process because of the shielding effect of the photoresist. FIGS. 5A and 5B depict trench fabrication that is the subject of U.S. Pat. No. 4,502,914. This invention provides a structure of polymeric material with vertical sidewalls, the latter serving to make sidewall structures of silicon dioxide or nitride with dimensions in the submicrometer range. These sidewall structures can be used as masks directly. For the negative lithography, another layer is alternatively applied over the sidewall structures using a planarization which is partly removed until the peaks of the sidewall structures are exposed. Subsequently the sidewall structures themselves are removed. The resulting opening can then be used as a mask for trench formation. Providing uniformity of the planarization layer over the sidewall structures can be difficult using this method due to the fact that the sidewall structures can disrupt the flow of resist or other material during the spin.

Since the trenches are fabricated after the substrate has been exposed, the key to narrow, self-aligned isolation trenches is exposing a highly predictable narrow substrate region. The etch mask fabrication of the present embodiment facilitates even narrower, self-aligned trenches, with a minimum amount of masking steps using a deposition layer to precisely define the narrow spacing.

SUMMARY OF THE INVENTION

This invention utilizes a primary mask of photoresist, created using conventional photolithography, to create a secondary mask, having vertical film layer segments. The primary mask patterns a silicon dioxide layer segment that protects a substrate region where integrated circuit structures will later be fabricated. The silicon dioxide layer segment is part of the secondary mask and its perimeter defines the inner perimeter of the region that will be trenched in order to isolate the circuit structures. An expendable spacer layer is deposited on top of the silicon dioxide layer segment and the exposed substrate. The thickness of the expendable layer determines the width of a perimetric annular opening in the secondary mask. The perimetric annular opening may be created with a width as narrow as 0.1 $\mu$. The spacer layer may be polysilicon deposited by LPCVD. A thick protective layer is blanket deposited on top of the spacer layer, the primary consideration being that the spacer layer must be etchable with a high degree of selectivity over the protection layer. A blanket deposition of photoresist follows which results in the planarization of the in-process wafer. The protective layer and photoresist are then plasma etched at the same rate in order to expose the spacer layer adjacent to and capping the silicon dioxide segment, the balance of the spacer layer remaining covered by the protection layer. At this point, the vertical portions of the spacer layer are etched away to expose an annular opening of the substrate that is perimetric to the silicon dioxide layer segment. The foregoing process creates an etch mask, one application of which is etching the exposed substrate to form a narrow trench self-aligned to the outer perimeter of the silicon dioxide layer segment and the remaining spacer layer. The trench may be filled with oxide using either thermal growth or LPCVD, in order to provide isolation for future circuit structures fabricated on the substrate defined by the silicon dioxide segment. Once the silicon dioxide layer segment has been isolated by a trench, it resembles an island surrounded by a moat and will therefore be referred to as a mask island.

Because the width of the annular opening within the secondary mask is dependent on the thickness of the expendable spacer layer, the very narrow trench widths are possible. In addition, the resulting trench is self-aligned around its mask island. The process is easily adapted to current manufacturing techniques and has minimum manufacturing problems.

This masking technique may be used to create a variety of semiconductor structures. Although the technique was originally developed to isolate circuit structures within ultra high density DRAM arrays, the technique may also be used to create structural features of SRAM arrays where an increase in device density is desired.

BRIEF DESCRIPTION OF THE DRAWINGS

FIGS. 2, 3, 4, and 5 are prior art trench isolation of integrated circuit regions.

FIGS. 6 through 25 depict a portion of an inprocess wafer during different process stages. Figures representing contemporaneous process stages have identical ordinal number designations (e.g., FIGS. 5A and 5B are contemporaneous views). Each "A" view is a cross section through the contemporaneous top planer "B" view.

DETAILED DESCRIPTION OF THE PREFERRED EMBODIMENT

In the semiconductor industry, electronic circuitry is fabricated on silicon substrate. Since the substrate is not an insulator, unwanted currents can flow from one circuit region to another through the substrate. Although the masking method of the present embodiment fabricates a narrow trench around an individual circuit region to isolate it from other circuit regions, the fabrication is very flexible, and may be used to pattern a multitude of features within semiconductor circuitry. Therefore, the description of the present embodiment emphasizes the fabrication of narrow spacings in the substrate for subsequent circuit patterning. Also, more than one circuit region may be treated in a similar manner; that is, a trench may be fabricated around each circuit region on an individual substrate by duplicating the following method pertinent to the isolation of one circuit region.

Figure 1:
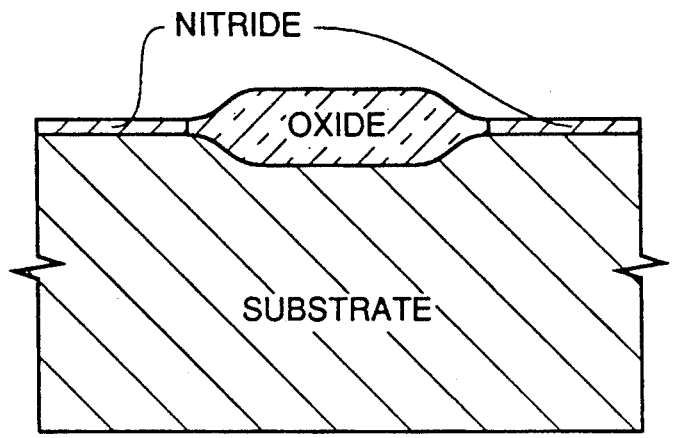
FIG. 1 depicts the prior art isolation of integrated circuit regions.
Figure 2:
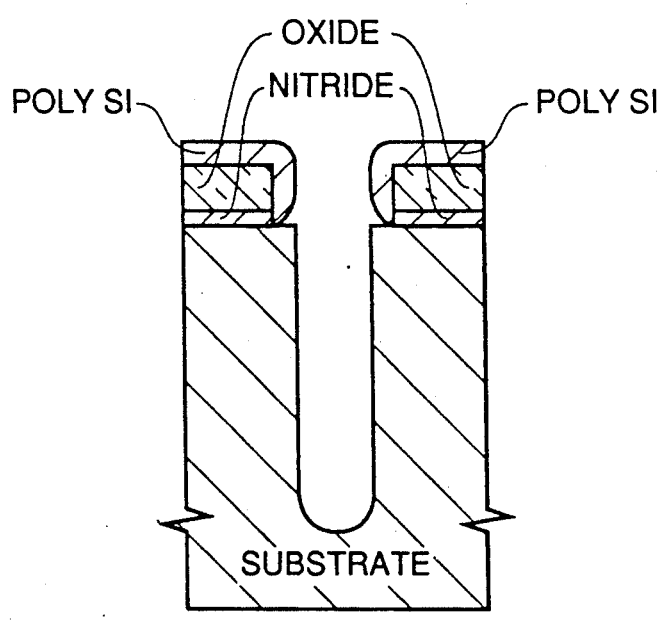
Figure 5A:
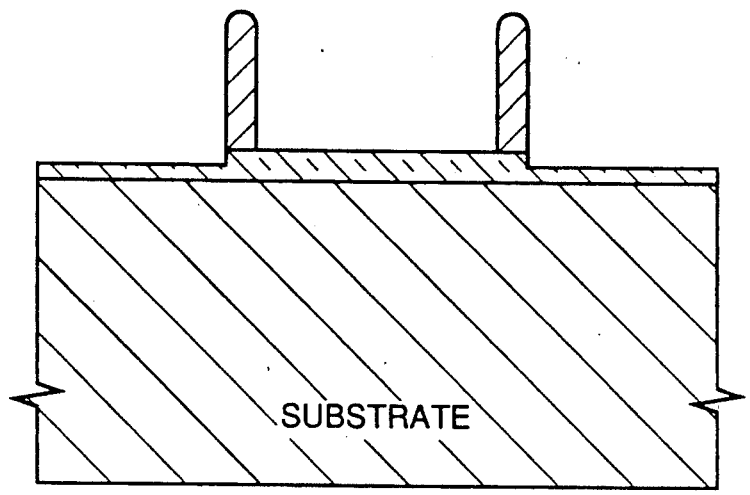
Figure 5B:
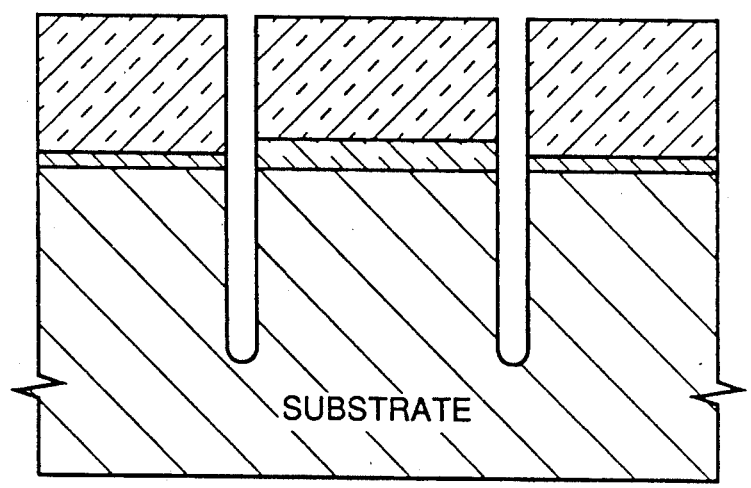
Figure 6A:
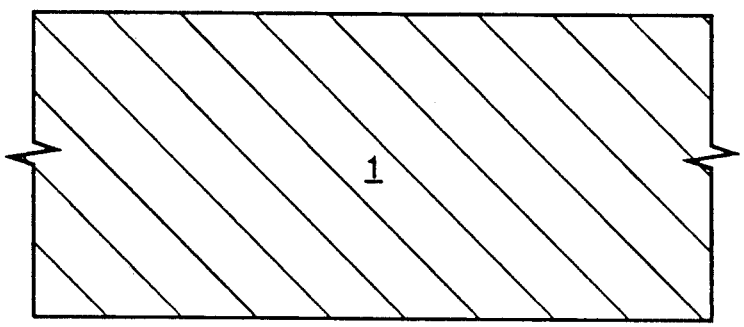
FIGS. 6A and 6B are unprocessed silicon substrate.
Figure 6B:
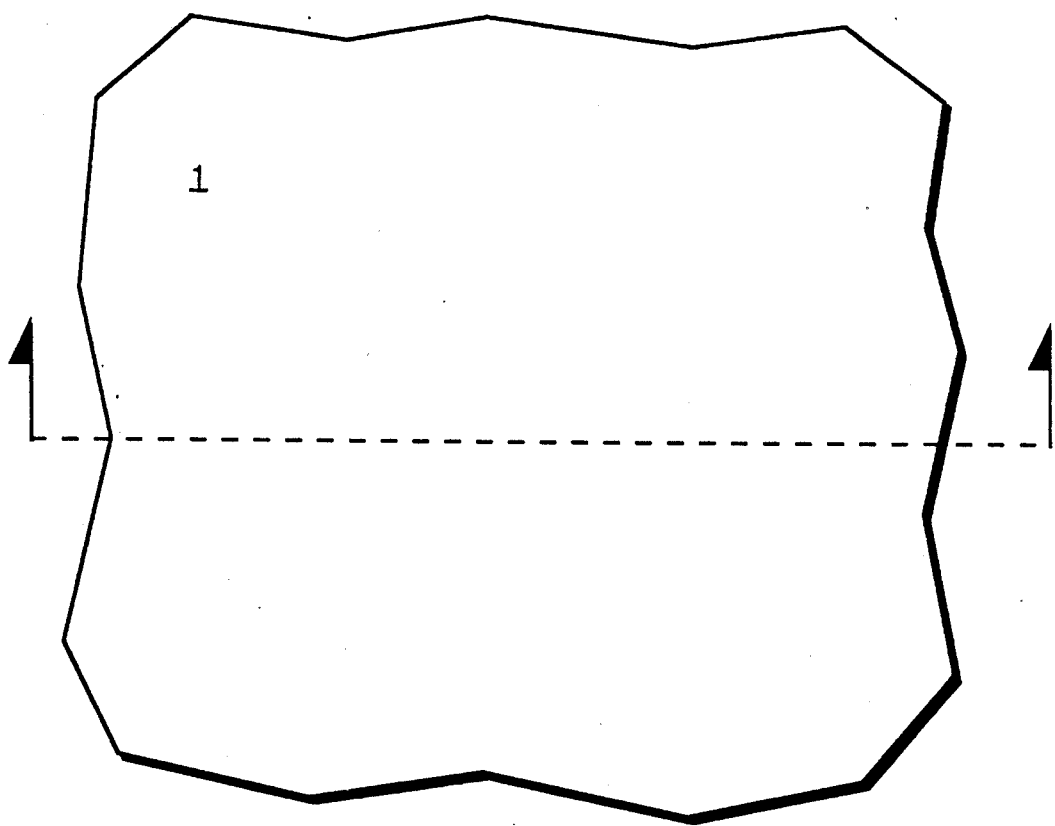

In FIGS. 6 through 25, the "A" figures represent a cross sectional view of narrow spacing and trench fabrication processes and the "B" figures represent a top planar view of each corresponding figure "A". FIGS. 6A and 6B depict a portion of an in-process silicon wafer showing substrate 1.

Figure 7A:
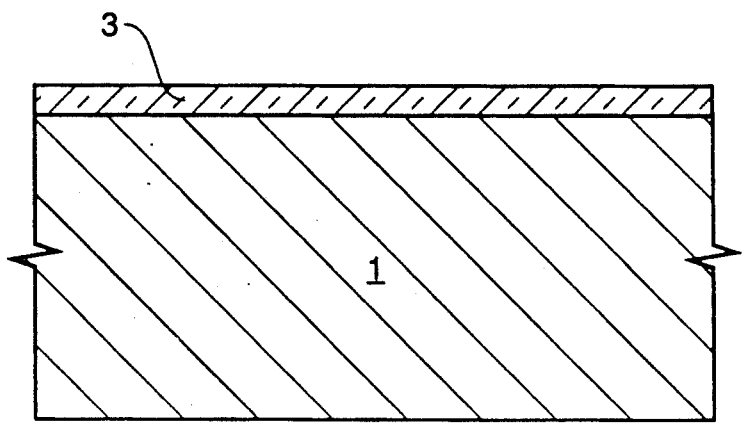
FIGS. 7A and 7B represent the substrate of FIGS. 6A and 6B, respectively, following the thermal growth of a thin-oxide layer.
Figure 7B:
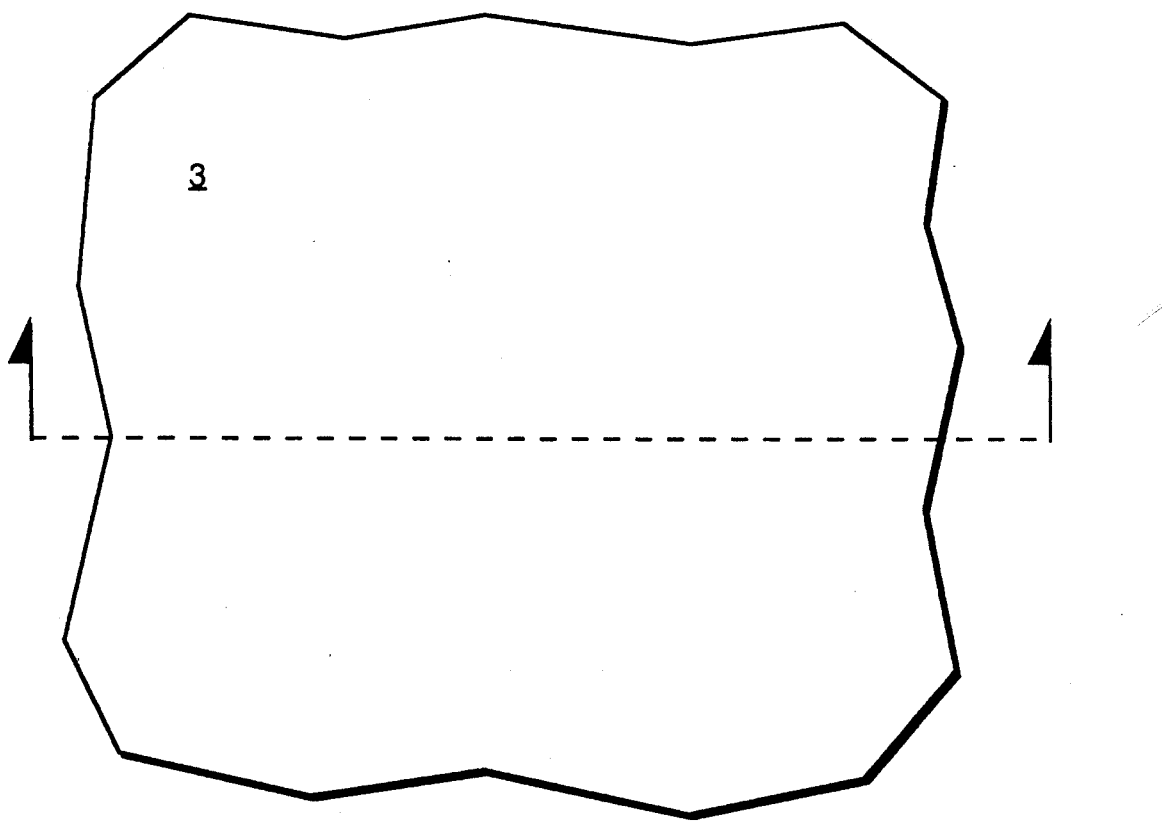

In FIGS. 7A and 7B, a thin oxide layer 3 is thermally grown on the substrate 1 in a diffusion oven. The thin oxide layer 3 offers protection for the substrate 1 during subsequent layerization and etching.

Figure 8A:
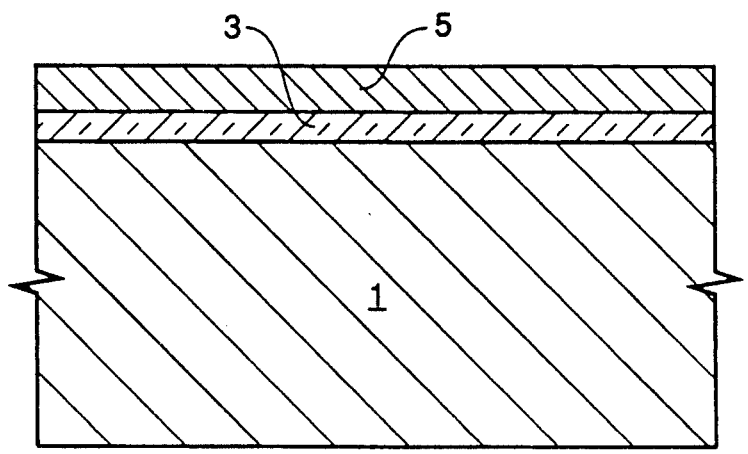
FIGS. 8A and 8B represent the in-process wafer portion of FIGS. 7A and 8A, respectively, following the blanket deposition of nitride.
Figure 8B:
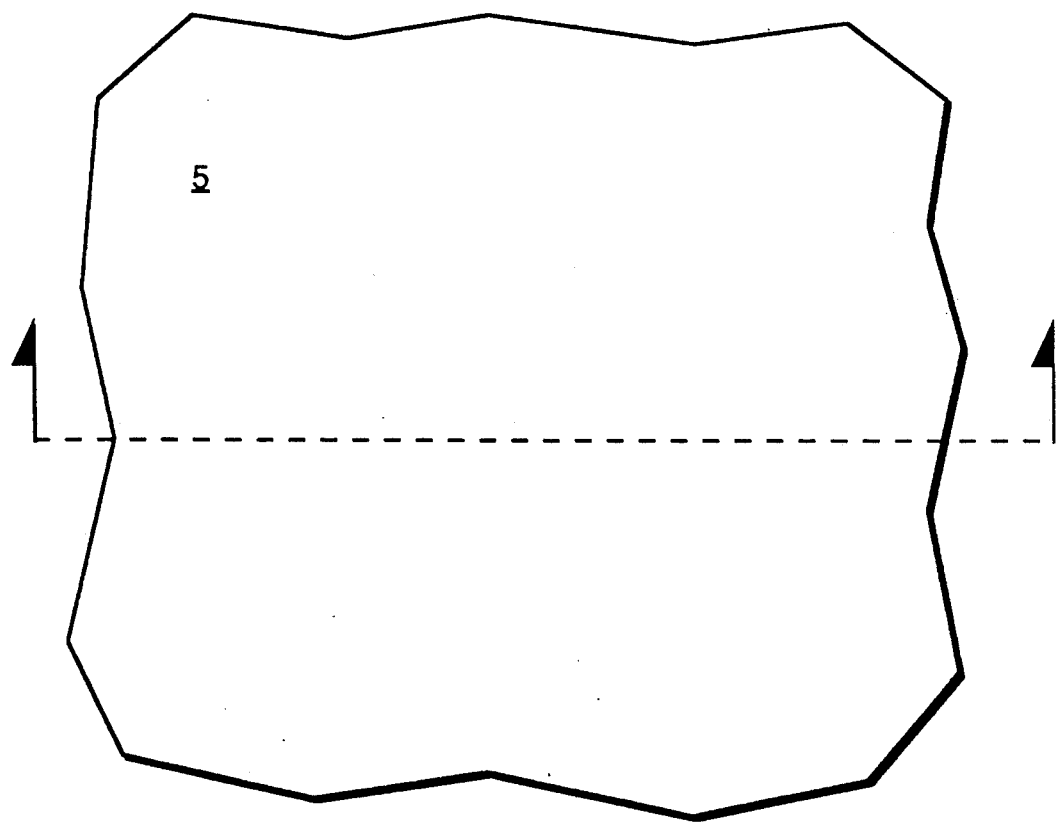

In order to provide a future barrier against oxidation of substrate 1 during subsequent circuit fabrication steps, a nitride layer 5 may be optionally deposited by LPCVD as shown in FIGS. 8A and 8B.

Figure 9A:
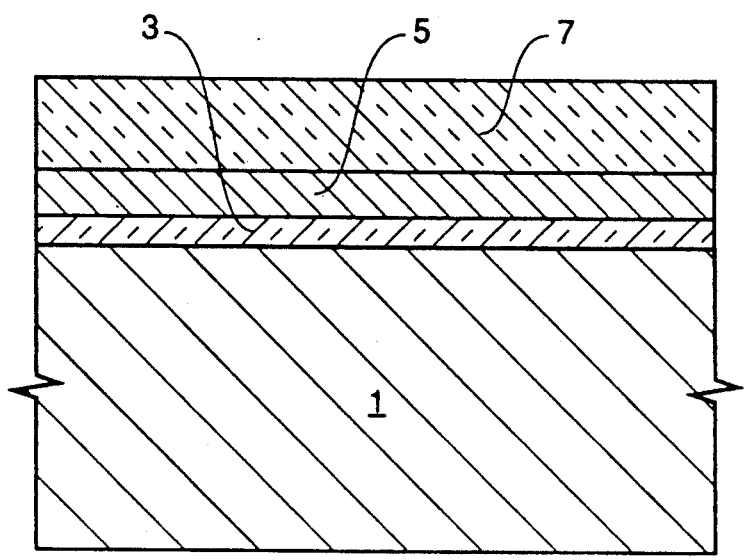
FIGS. 9A and 9B represent the in-process wafer portion of FIGS. 8A and 8B, respectively, following the deposition of a base layer of silicon dioxide.
Figure 9B:
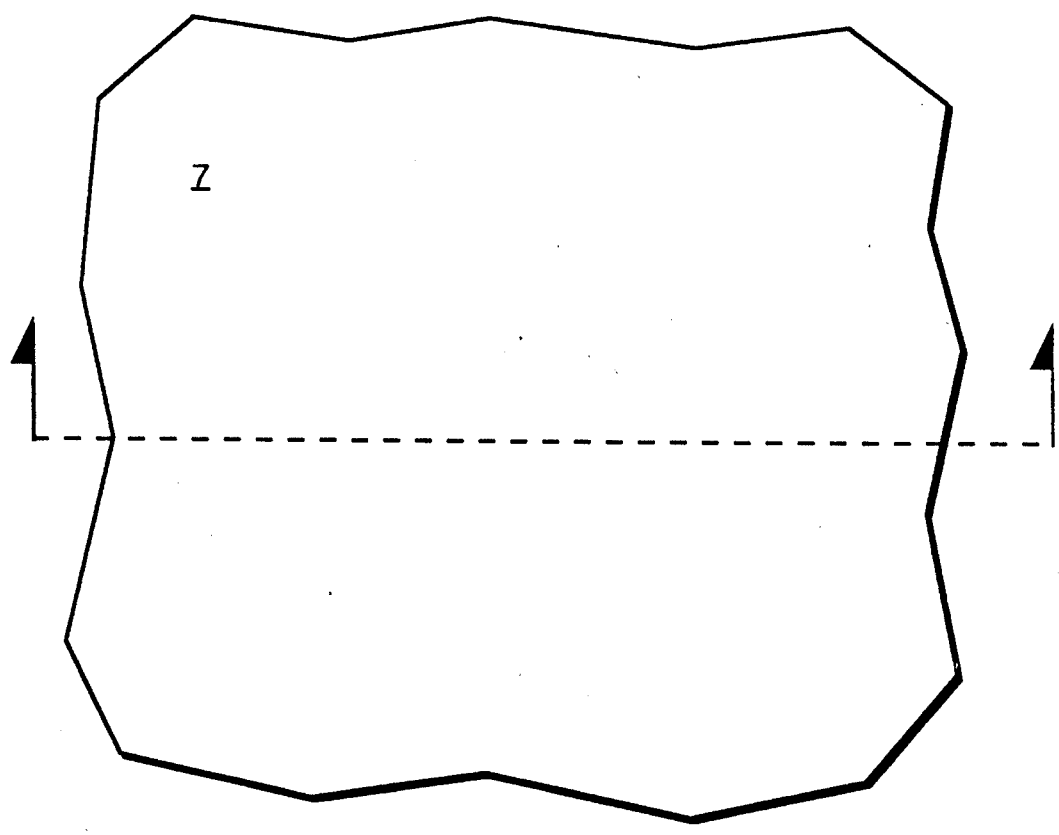
Figure 10A:
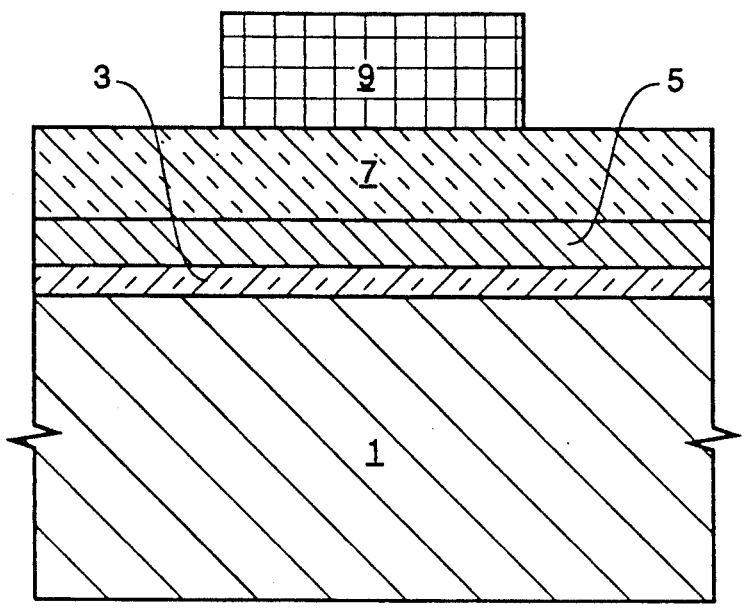
FIGS. 10A and 10B represent the in-process wafer portion of FIGS. 8A and 8B, respectively, masking the base layer of photoresist oxide.
Figure 10B:
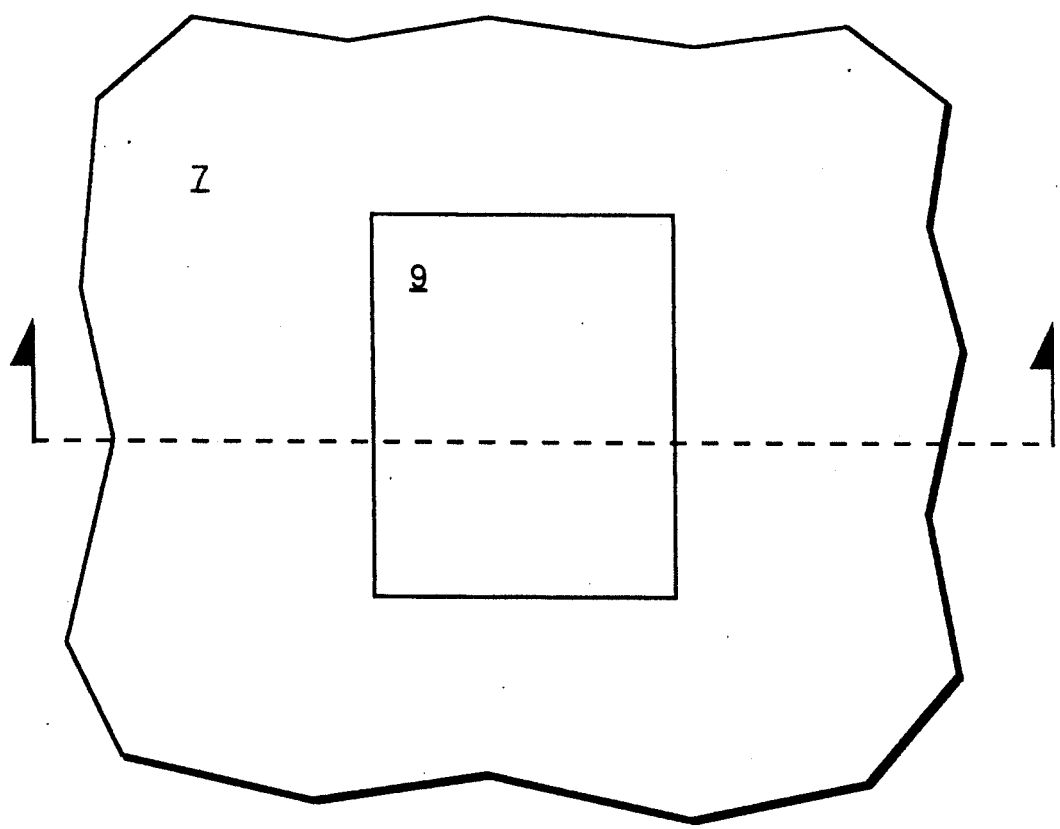

FIGS. 9A and 9B show the initial layerization of the in-process wafer after deposition of a base layer of silicon dioxide 7. The layerization is conventionally masked with a primary photoresist mask 9 shown in FIGS. 10A and 10B.

Figure 11A:
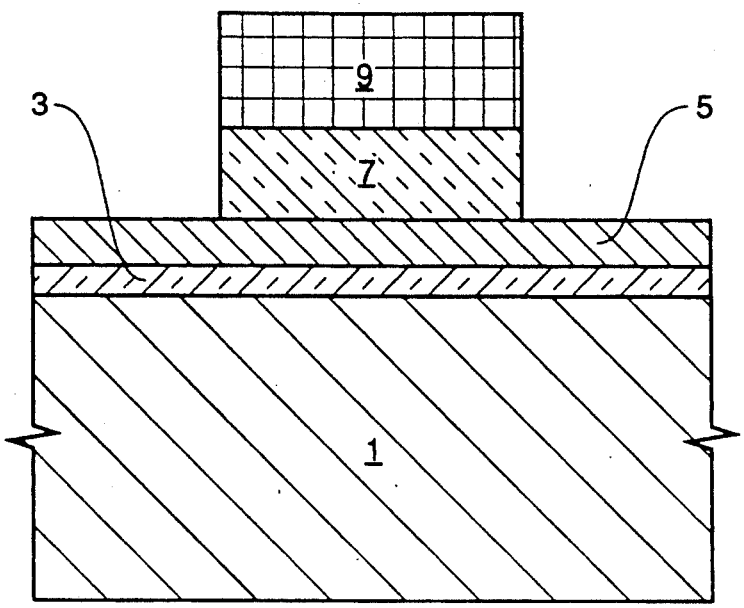
FIGS. 11A and 11B represent the in-process wafer portions of FIGS. 9A and 9B, respectively, following an etch of the base layer of photoresist oxide.
Figure 11B:
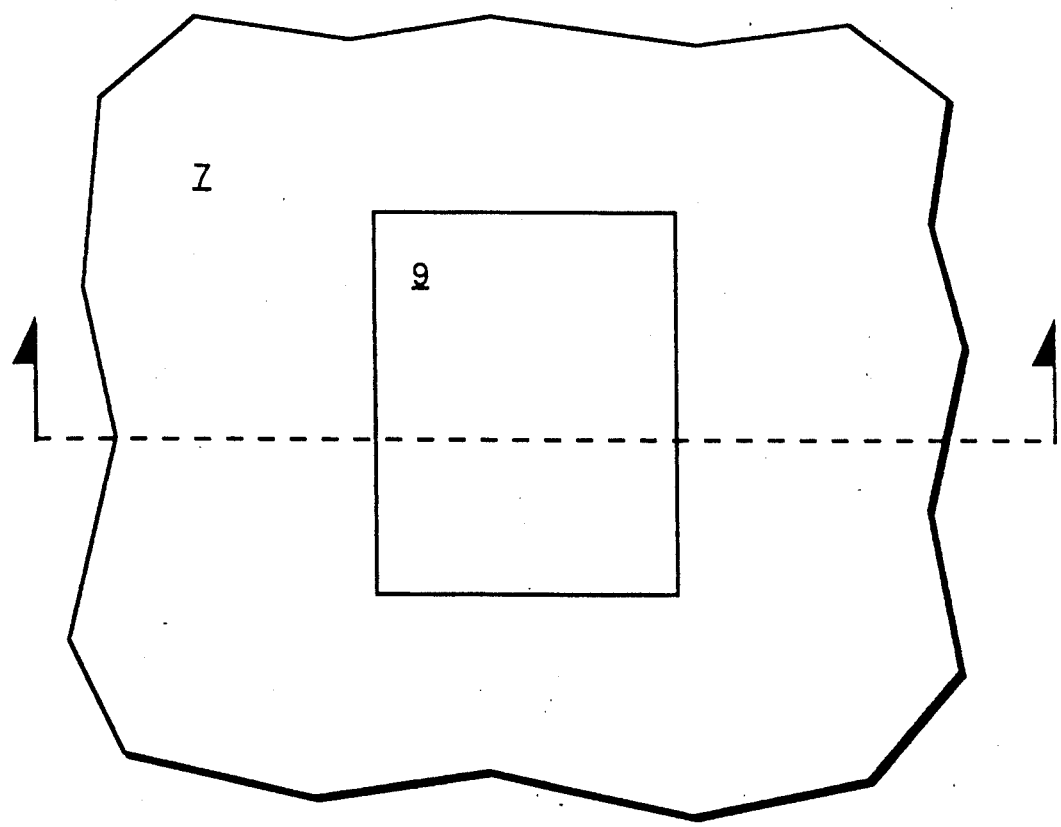

FIGS. 11A and 11B depict the layerization after an anisotropic etch of the base layer of silicon dioxide 7, the optional nitride layer 5 and thin oxide layer 3 remaining intact.

Figure 12A:
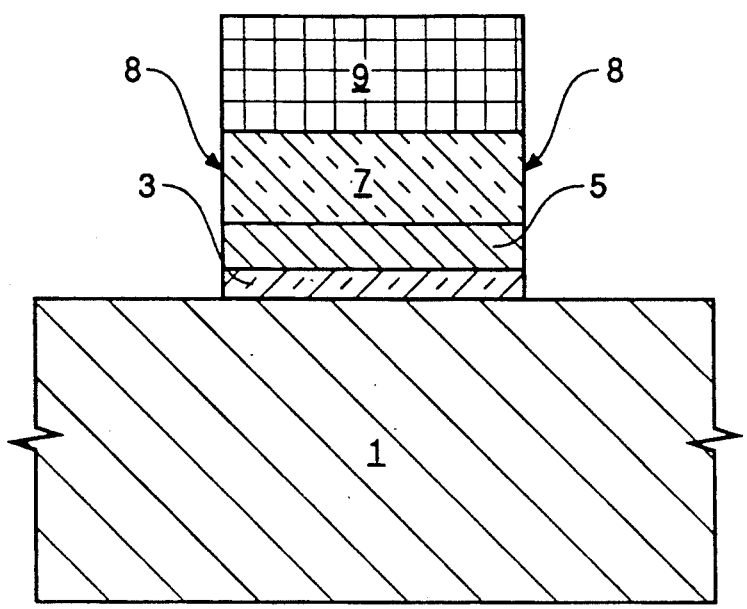
FIGS. 12A and 12B represent the in-process wafer portion of FIGS. 11A and 11B, respectively, following an etch of the nitride layer.
Figure 12B:
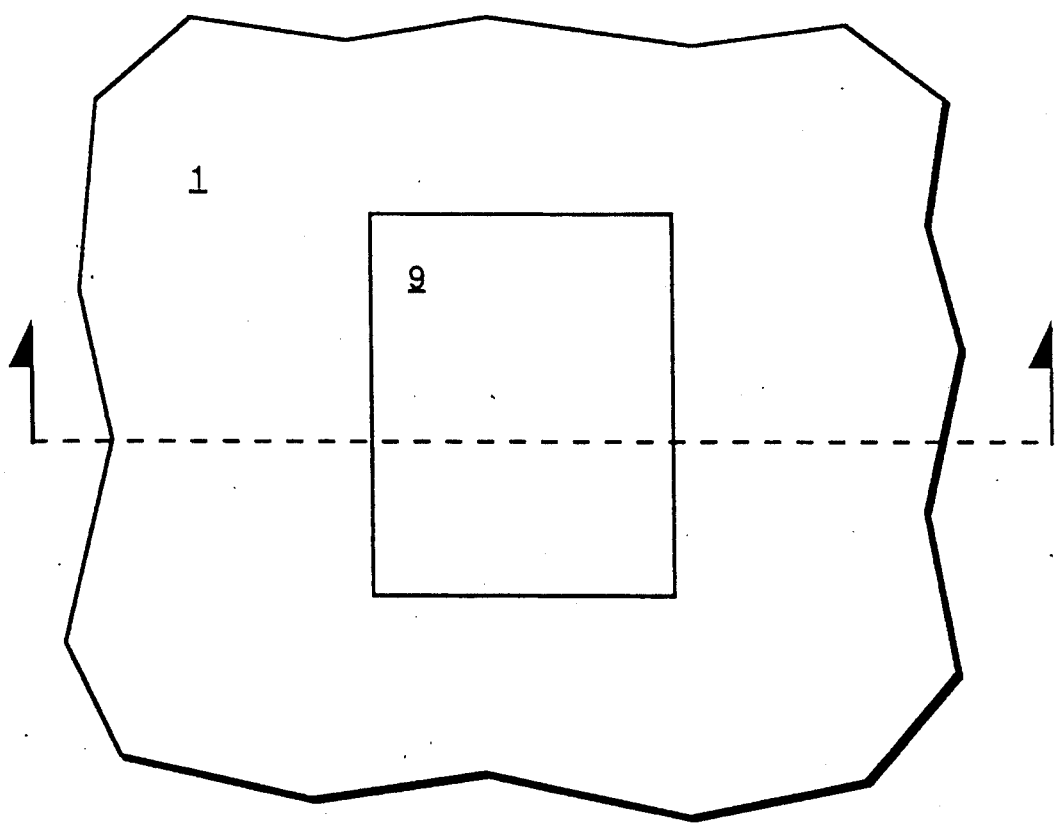

The optional nitride layer 5 is etched to form the mask island 8 shown in FIGS. 12A and 12B. The layered mask defines the region in the substrate reserved for electronic circuitry and includes the 3 initial layers of the thin oxide 3, nitride 5 and silicon dioxide 7. The trenches of the present embodiment will isolate the substrate defined by the mask island from other areas of the substrate.

Figure 13A:
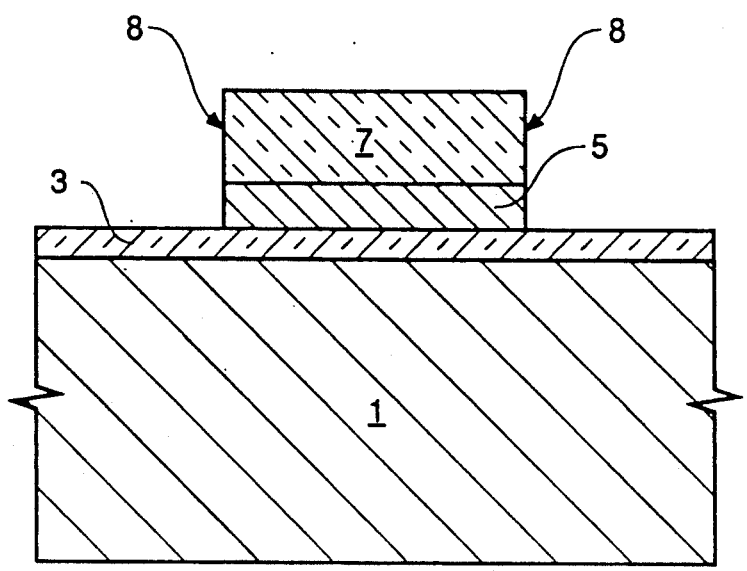
FIGS. 13A and 13B represent the in-process wafer portions of FIGS. 12A and 12B, respectively, following a reoxidation of the substrate.
Figure 13B:
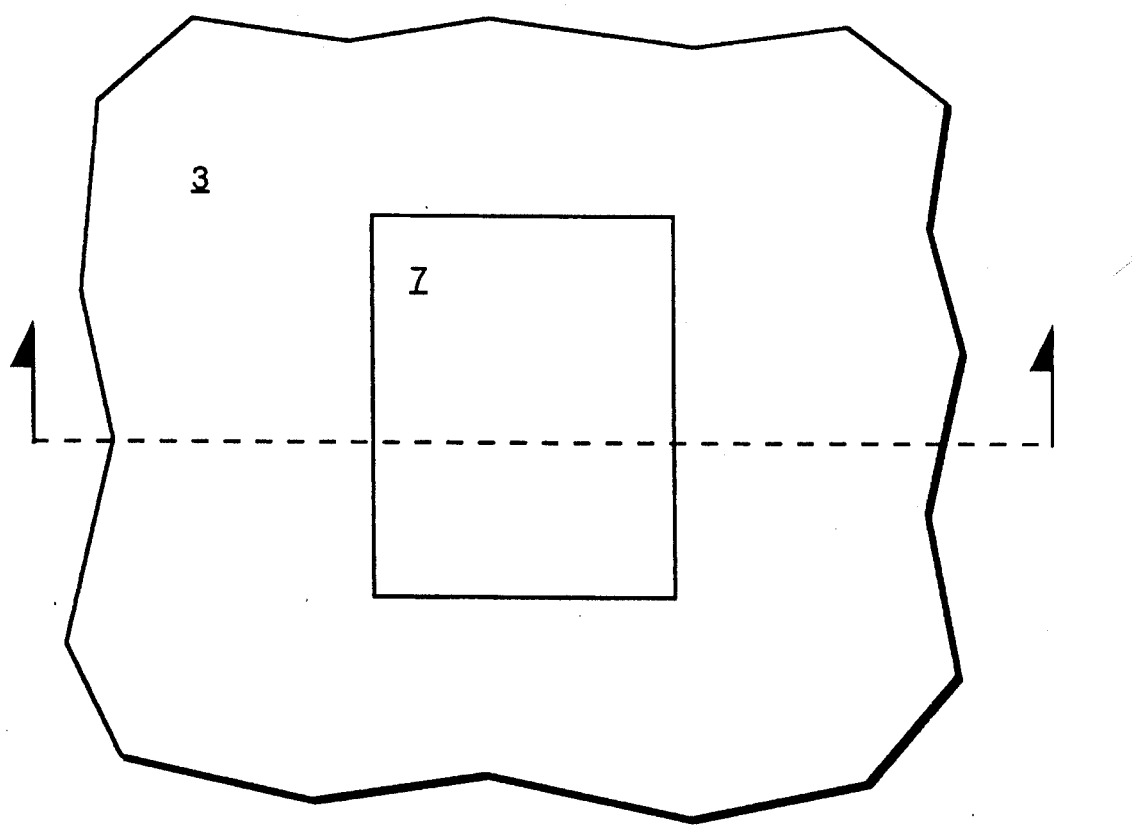

In FIGS. 13A and 13B, the substrate is subject to thermal reoxidation in order to ensure that the thin oxide layer 3 remains intact. FIG. 13B clearly illustrates the circuitry region defined by the mask island 8.

Figure 14A:
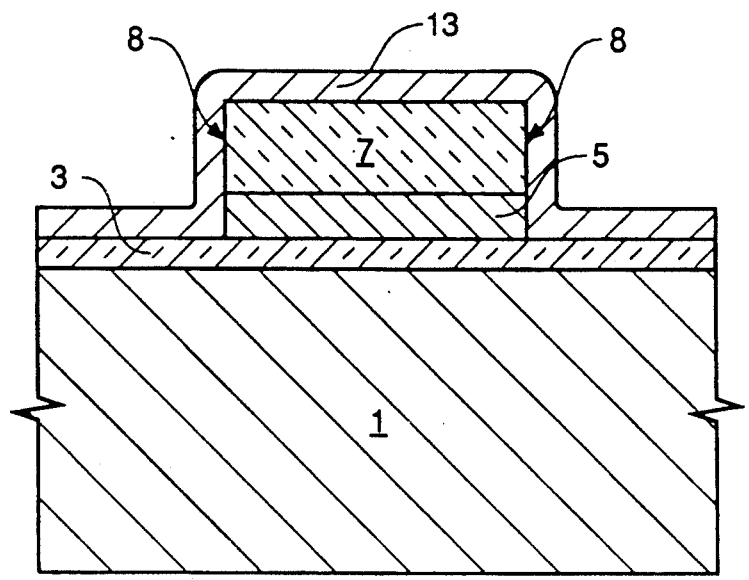
FIGS. 14A and 14B represent the in-process wafer portion of FIGS. 13A and 13B, respectively, following a polysilicon deposition.
Figure 14B:
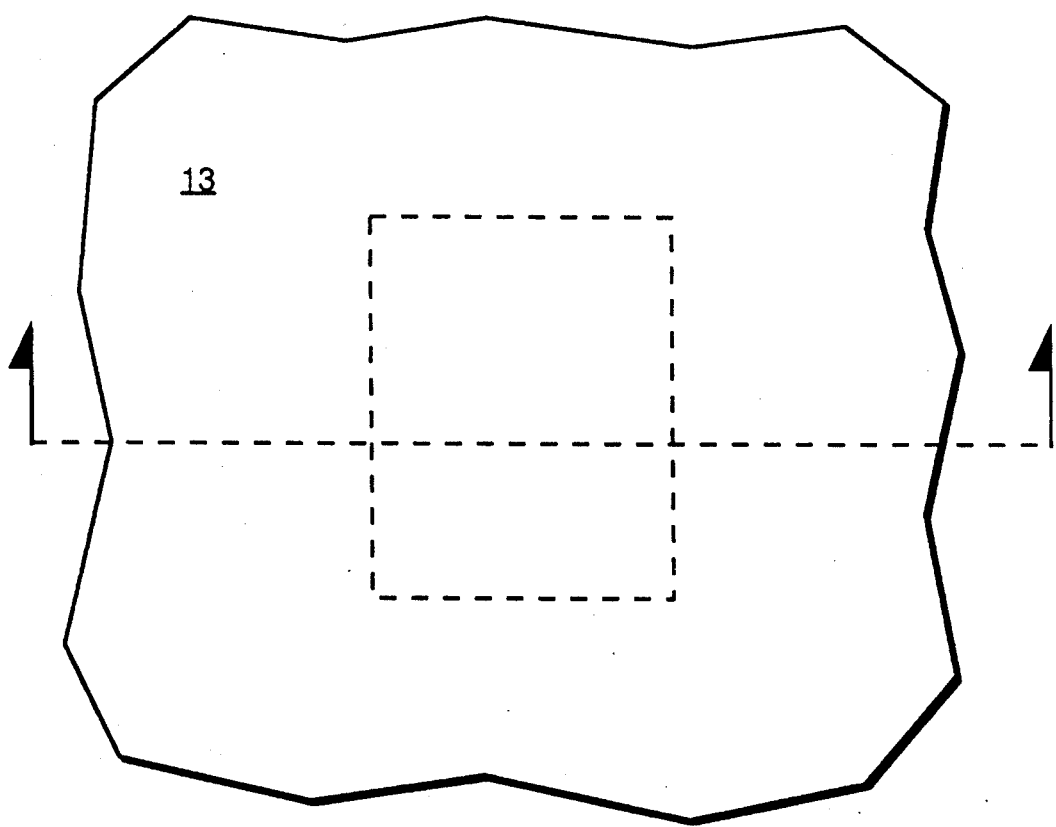

Referring now to FIG. 14A, a conformal expendable polysilicon spacer layer 13 is blanket deposited by LPCVD on the mask island 8 and thin oxide layer 3. It is important that the thickness of the polysilicon spacer layer 13 correspond to the desired trench thickness after deposition since the polysilicon thickness defines the subsequent width of the substrate 1 exposed for eventual trench fabrication. FIG. 14B depicts the blanket deposition of polysilicon on the in-process wafer.

Figure 15A:
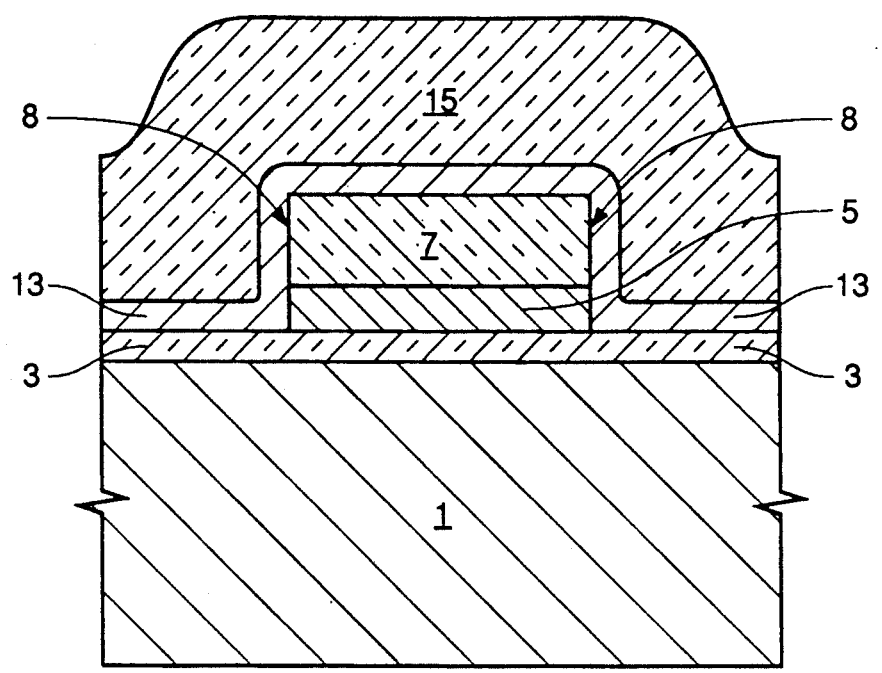
FIGS. 15A and 15B represent the in-process wafer portion of FIGS. 13A and 13B, respectively, following an oxide deposition.
Figure 15B:
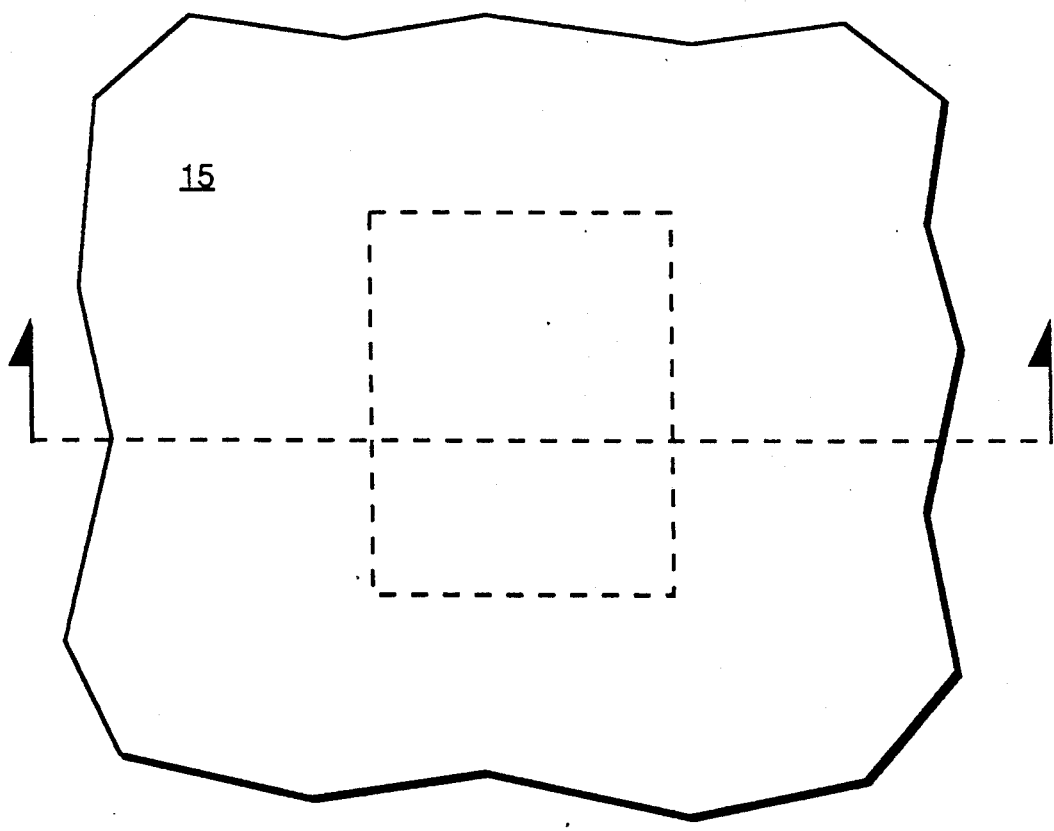
Figure 16A:
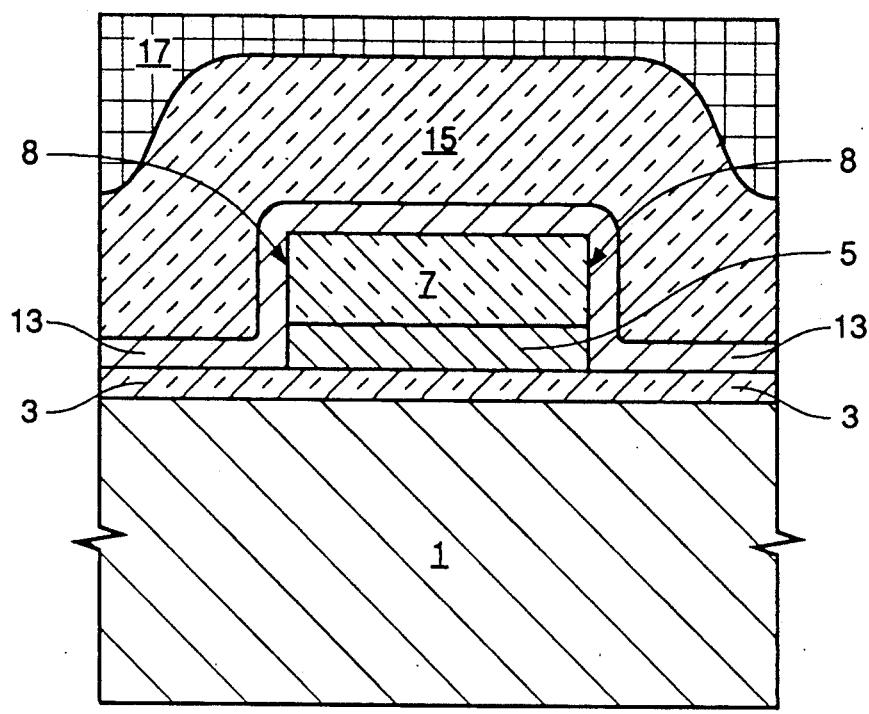
FIGS. 16A and 16B represent the in-process wafer portion of FIGS. 15A and 15B, respectively, following a photoresist application to planarize the wafer.
Figure 16B:
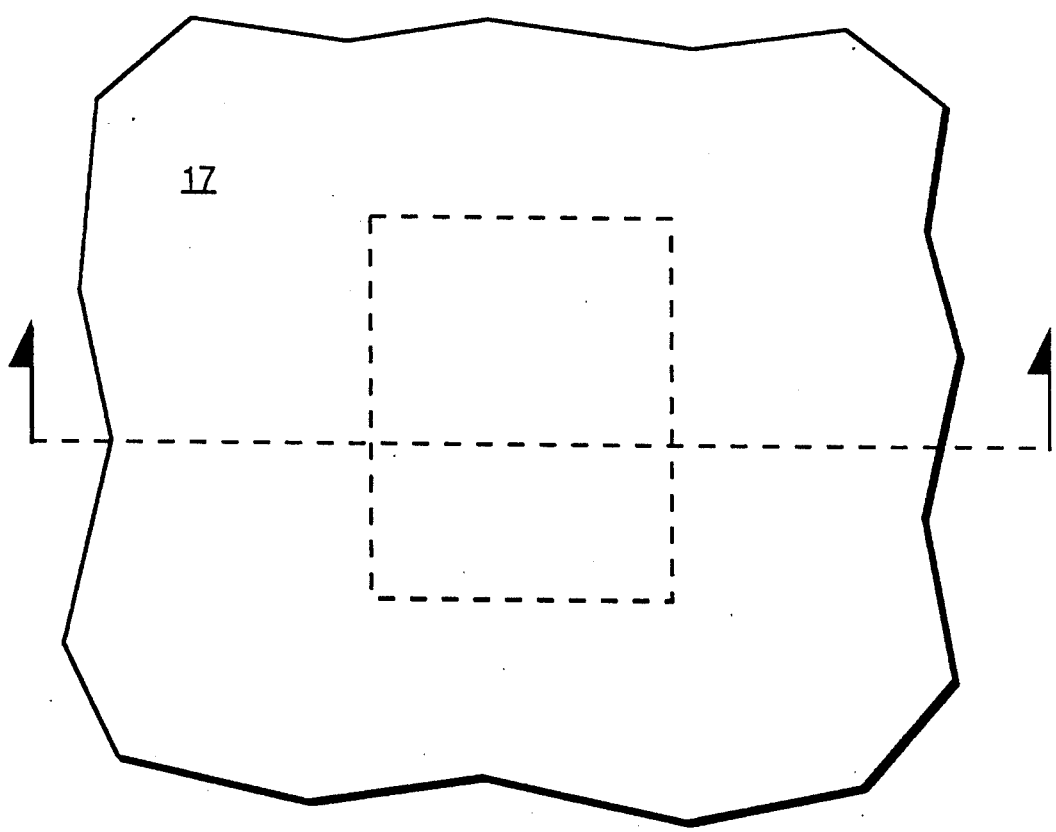

Referring to FIGS. 15A and 15B, a protective oxide layer 13 is blanket deposited on the polysilicon spacer layer by either LPCVD or by the tetra ethyl ortho silicate, (TEOS), process. The polysilicon 13 having been selected for its high degree of selectivity with respect to its being etchable over the mask island and oxide layer FIGS. 16A and 16B depict the final layerization of the wafer with a planarized layer of photoresist resin 17.

Figure 17A:
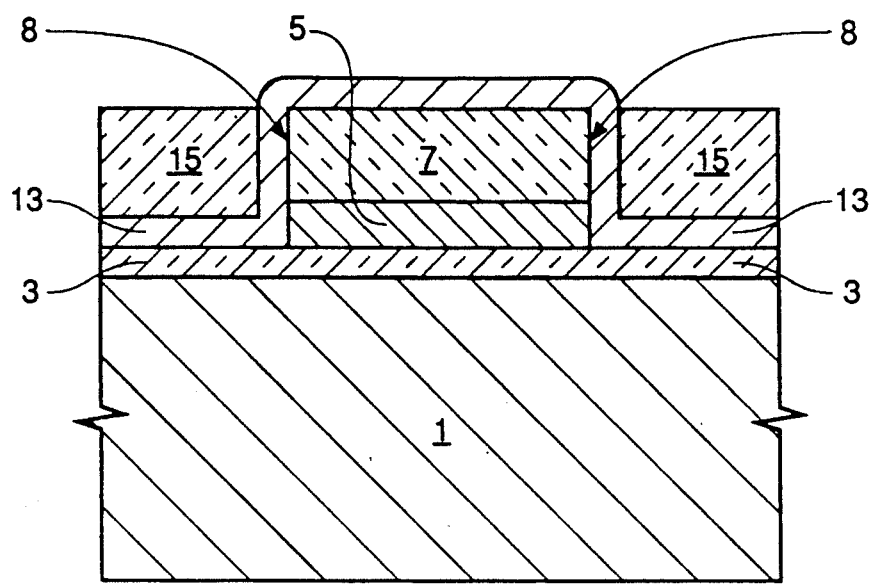
FIGS. 17A and 17B represent the in-process wafer portion of FIGS. 15A and 15B, respectively, following a uniform rate etch of the photoresist and final oxide deposit.
Figure 17B:
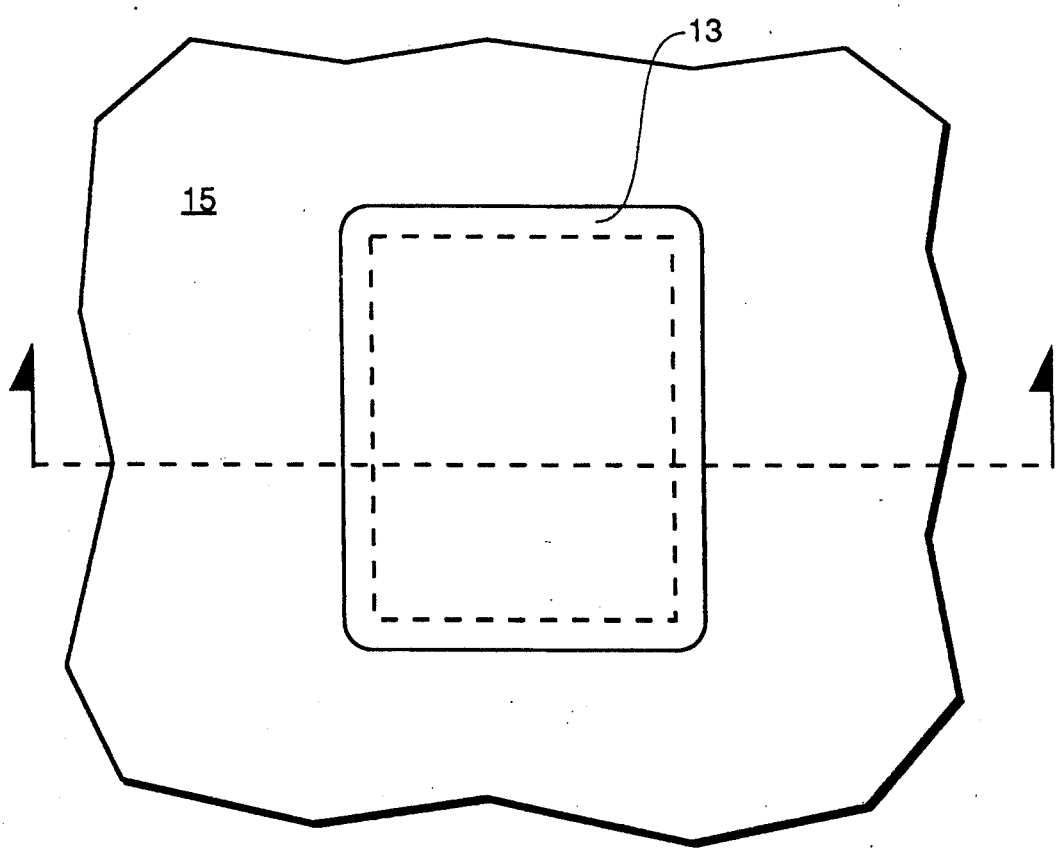

Referring to FIGS. 17A and 17B, the photoresist 17 and the oxide 15 are anisotropically etched with a plasma etch at the same rate to a level being at or below the top of the spacer layer 13 in order to expose the polysilicon spacer layer 13 above the mask island 8 and vertically adjacent to the island and extending away from the island a distance equal to the thickness of the polysilicon deposition. The remaining deposition of oxide 15 protects the polysilicon 13 that was not exposed by the etch. FIG. 17B illustrates the fact that there is now an island of polysilicon 13 resulting from the etching of the photoresist 17 and oxide 15. Alternately it is possible to eliminate the planarization of the wafer with photoresist and, instead, mechanically etch the oxide layer 15 to a level being at or below the top of the spacer layer 13 in order to expose the polysilicon spacer layer 13 of FIGS. 17A and 17B. It is also possible to planarize a portion of the polysilicon spacer 13 layer during the previous mechanical and plasma etches to the same level as the protective oxide layer.

Figure 18A:
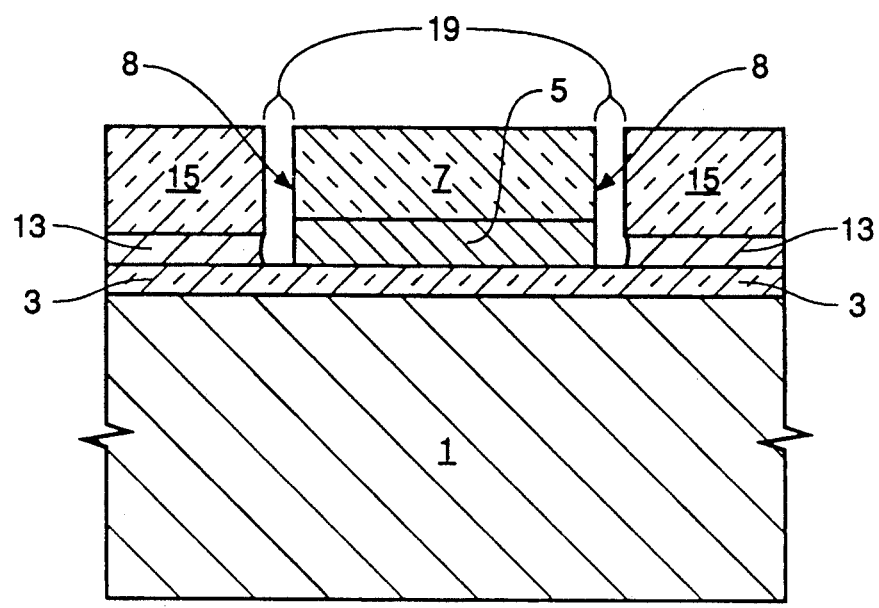
FIGS. 18A and 18B represent the in-process wafer portion of FIGS. 17A and 17B, respectively, following a polysilicon selective etch.
Figure 18B:
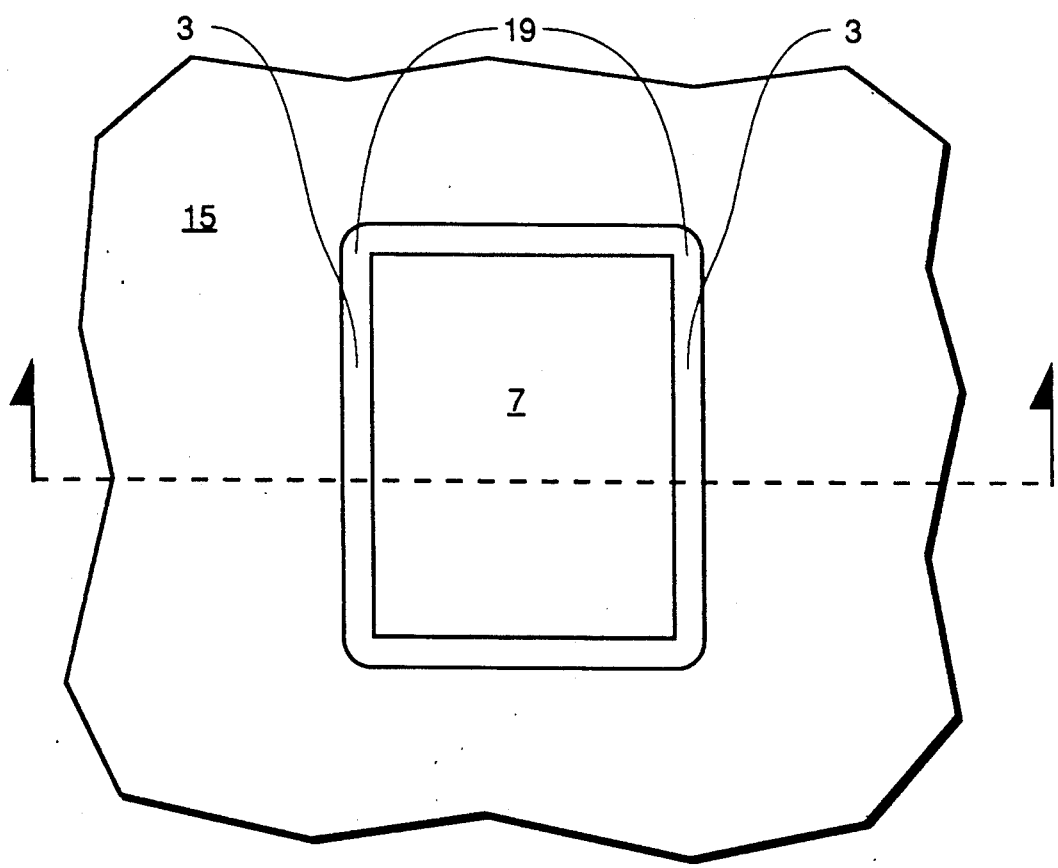

FIGS. 18A and 18B depict the result of isotropically etching the exposed polysilicon 13 adjacent to and capping the mask island 8. The polysilicon 13 protected by the remaining oxide 15 is not etched. The result of the polysilicon etch is an annular opening 19, whose sidewalls are the initial masked island 8 and the oxide 15 covering the remaining polysilicon 13. The floor of the annular opening consists of the thin oxide layer 3 exposed during the polysilicon etch. The width of this annular opening is equal to the original thickness of the polysilicon layer 13. The thin oxide layer 3 forming the floor of the depression is now over-etched to expose the substrate 1.

Figure 19A:
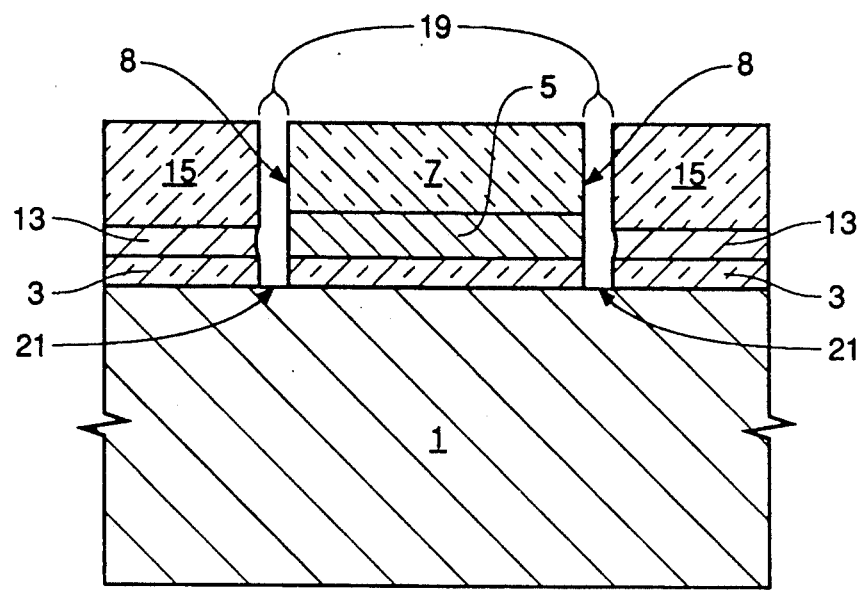
FIGS. 19A and 19B represent the in-process wafer portion of FIGS. 18A and 18B, respectively, following a final oxide etch.
Figure 19B:
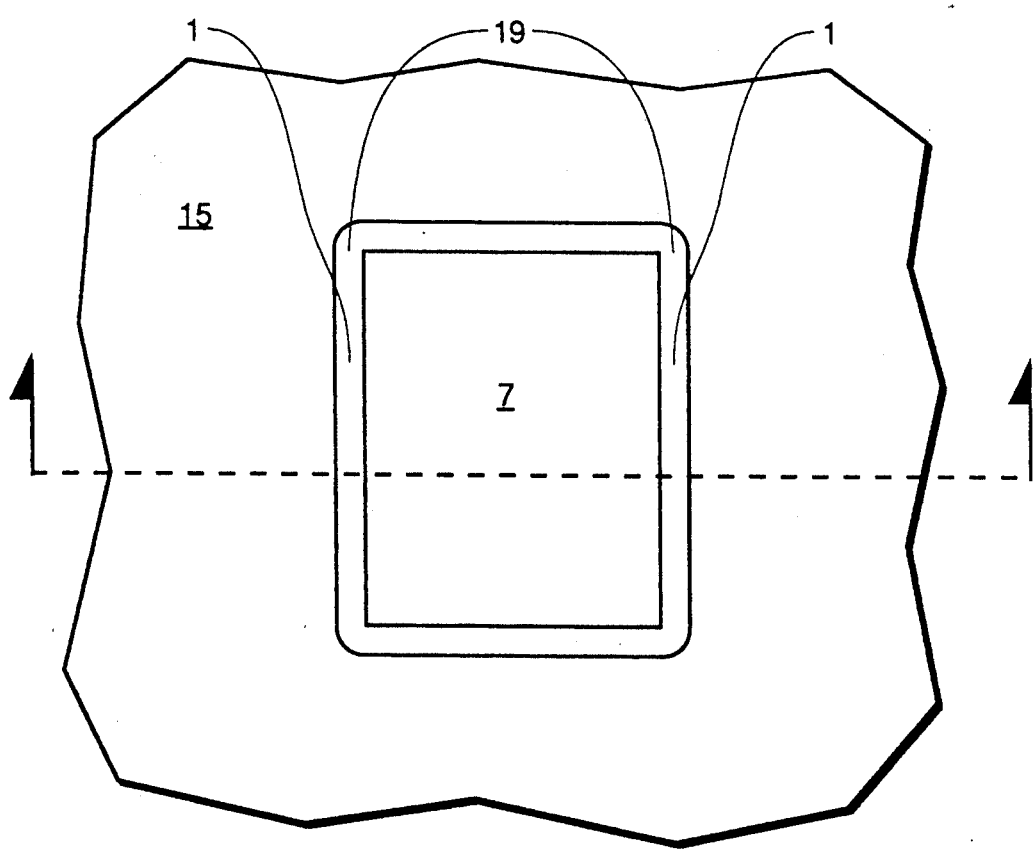

It can be seen from FIGS. 19A and 19B that the exposed substrate 21 surrounds the area defined by the mask island. The width of the exposed substrate 21 is equal to the thickness of the original polysilicon layer 13. Therefore, the width of the exposed substrate 21 is highly predictable and very narrow. At this juncture the etch mask for subsequent trench formation in the exposed substrate has been completed. This etch mask fabrication process also provides for the self-alignment of the exposed substrate 21 to the mask island 8 perimeter and the oxide 15 covered polysilicon 13.

Figure 20A:
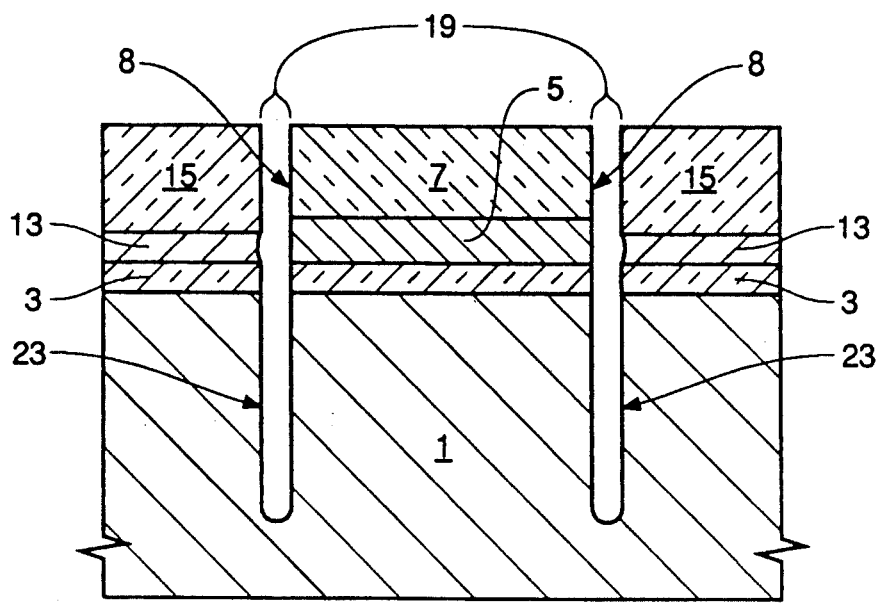
FIGS. 20A and 20B represent the in-process wafer portion of FIGS. 19A and 19B, respectively, following a substrate etch to form trenches.
Figure 20B:
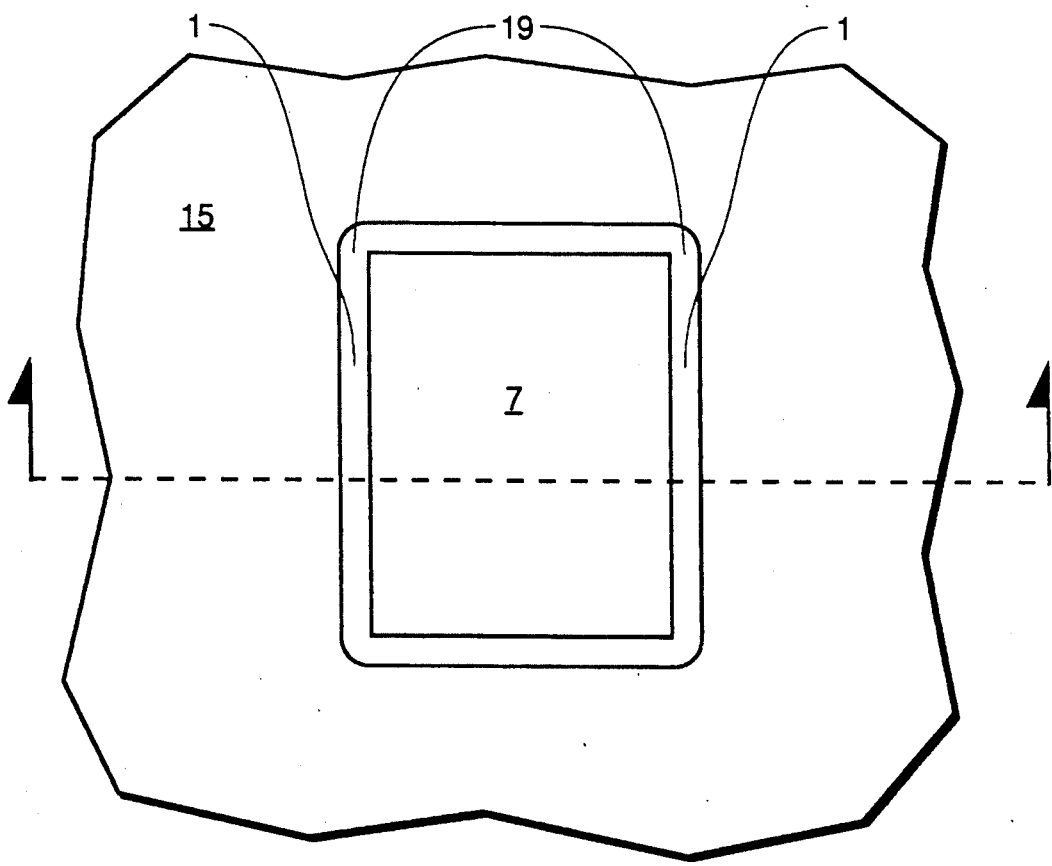

The trench 23 is now etched in the exposed substrate 21 using an anisotropic process that is highly selective for silicon. The mask island 8 and the remaining oxide 15 protecting the remaining polysilicon 13 function as a secondary patterning mask for trenching the substrate. The resultant trench is self-aligned to the mask island 8 and the protected polysilicon 13. The fabricated trench 23 is shown in FIGS. 20A and 20B. Although FIGS. 19B and 20B look identical, the substrate in FIG. 20B has been trenched, whereas the substrate of FIG. 19B is in its original state.

Figure 21A:
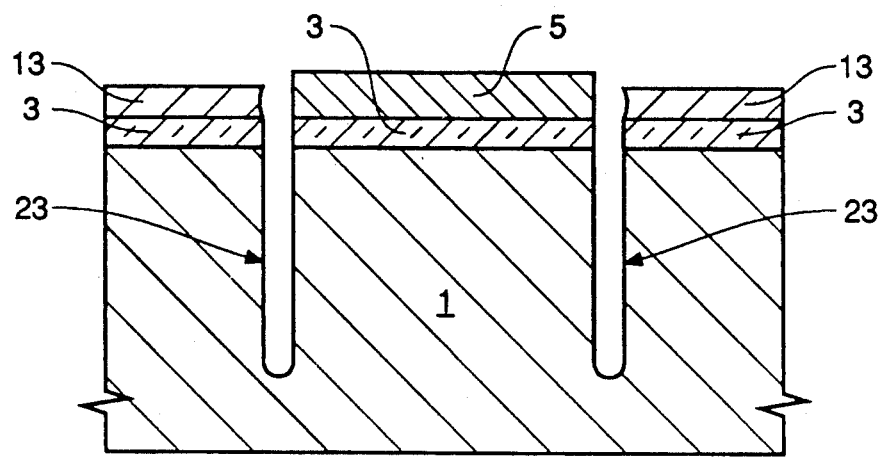
FIGS. 21A and 21B represent the in-process wafer portion of FIGS. 20A and 20B, respectively, following etching of the oxide deposits.
Figure 21B:
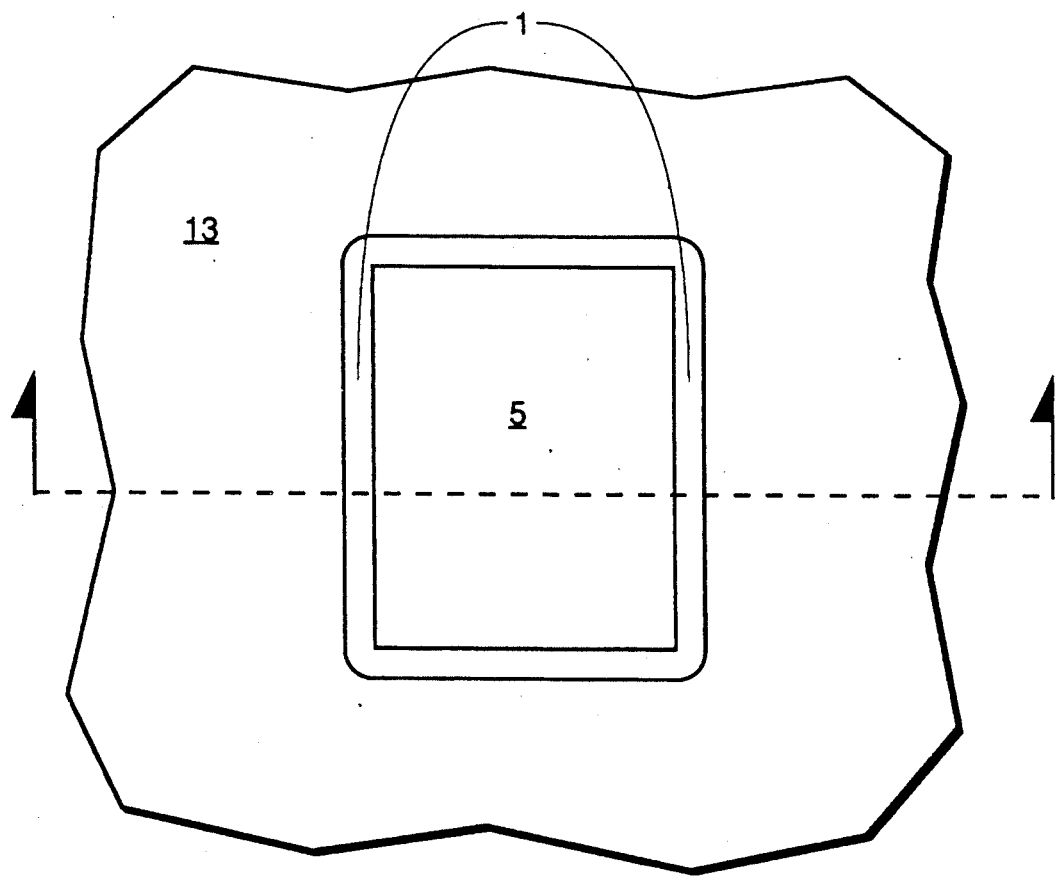
Figure 22A:
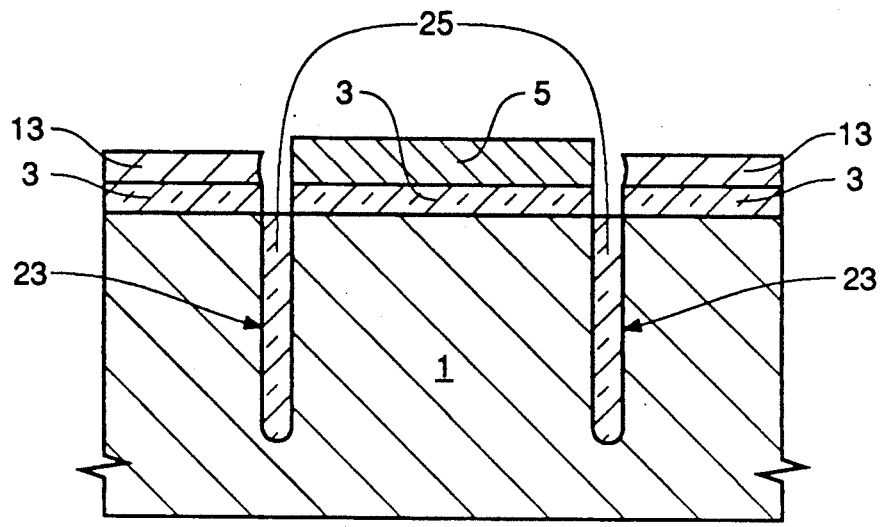
FIGS. 22A and 22B represent the in-process wafer portion of FIGS. 20A and 20B, respectively, following oxidation of the trenches.
Figure 22B:
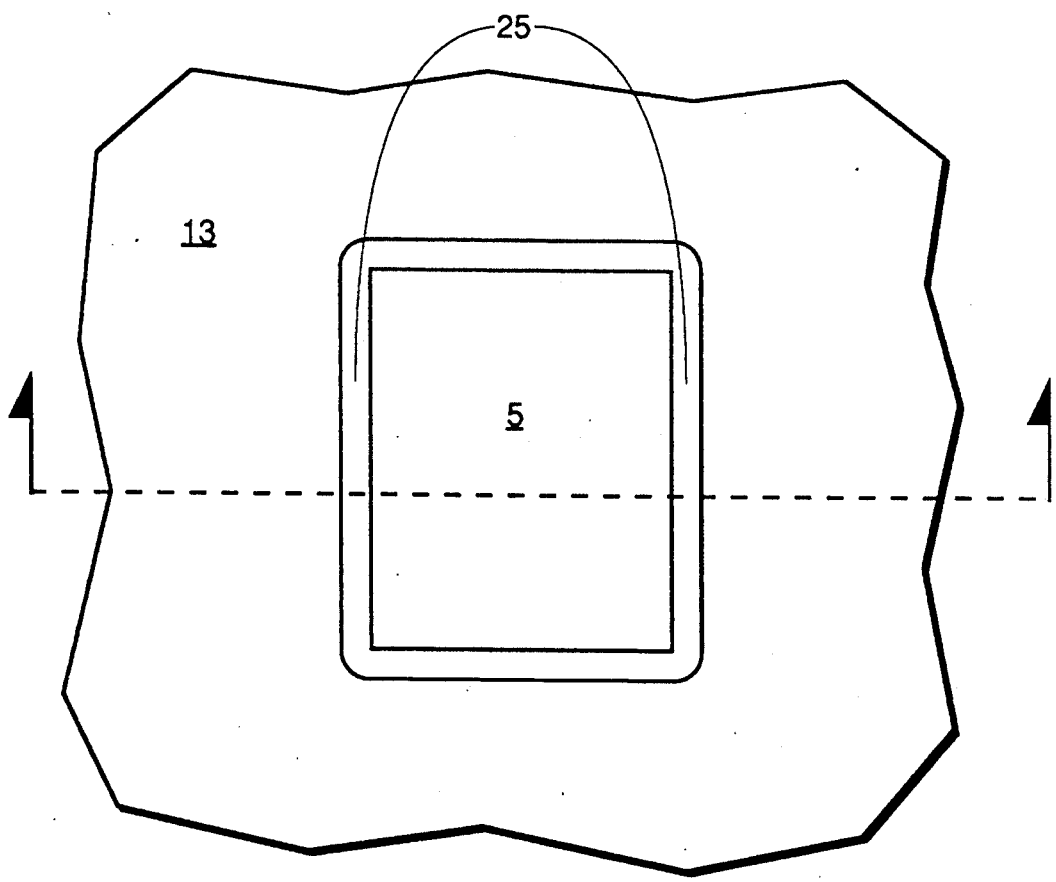

In FIGS. 21A and 21B, the silicon dioxide layer 7 and the protective oxide layer 15 have been isotropically etched leaving the nitride layer 5 surrounded by a narrow trench 23. At this time, oxide is either deposited in the trench or thermally grown in a diffusion oven from each sidewall of the trench. This oxide growth is possible because the trench is so narrow. A 0.2 $\mu$ trench will consume only 0.1 $\mu$ of silicon. This is equal to the radius of the trench and will therefore fill it. In either case, minimal oxide is needed because of the narrowness of the trench. FIGS. 22A and 22B depict the trench once it has been filled with oxide 25. The resultant trench has its inner perimeter self-aligned to the perimeter of the island and its outer perimeter self-aligned to the remaining polysilicon. The trench has a narrow width exactly equal to the thickness of the polysilicon deposition spacer layer 13, thus facilitating even denser circuit fabrication. The method of forming trenches in this embodiment results in the exact placement and a predictable width of the isolation trenches. These facts, coupled with the minimum masking steps this method entails, creates a significant advance in isolation trench formation.

Figure 23A:
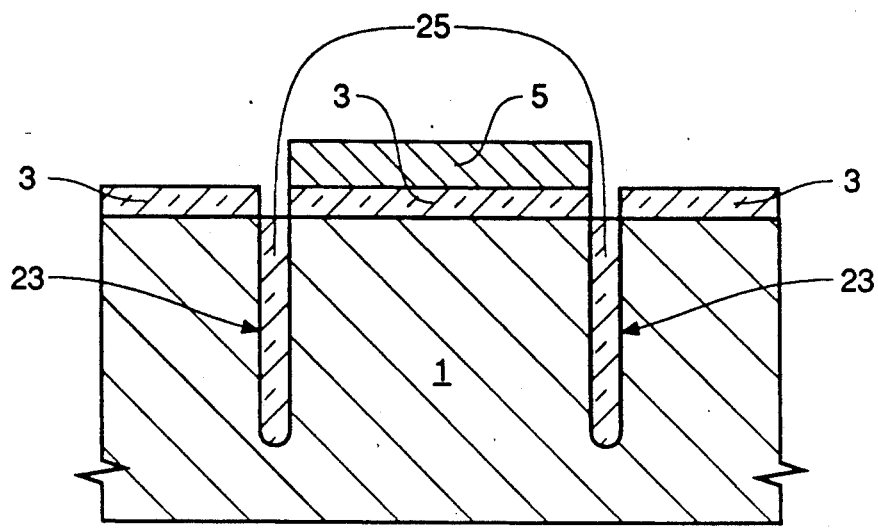
FIGS. 23A and 23B represent the in-process wafer portion of FIGS. 22A and 22B, respectively, following a final etch.
Figure 23B:
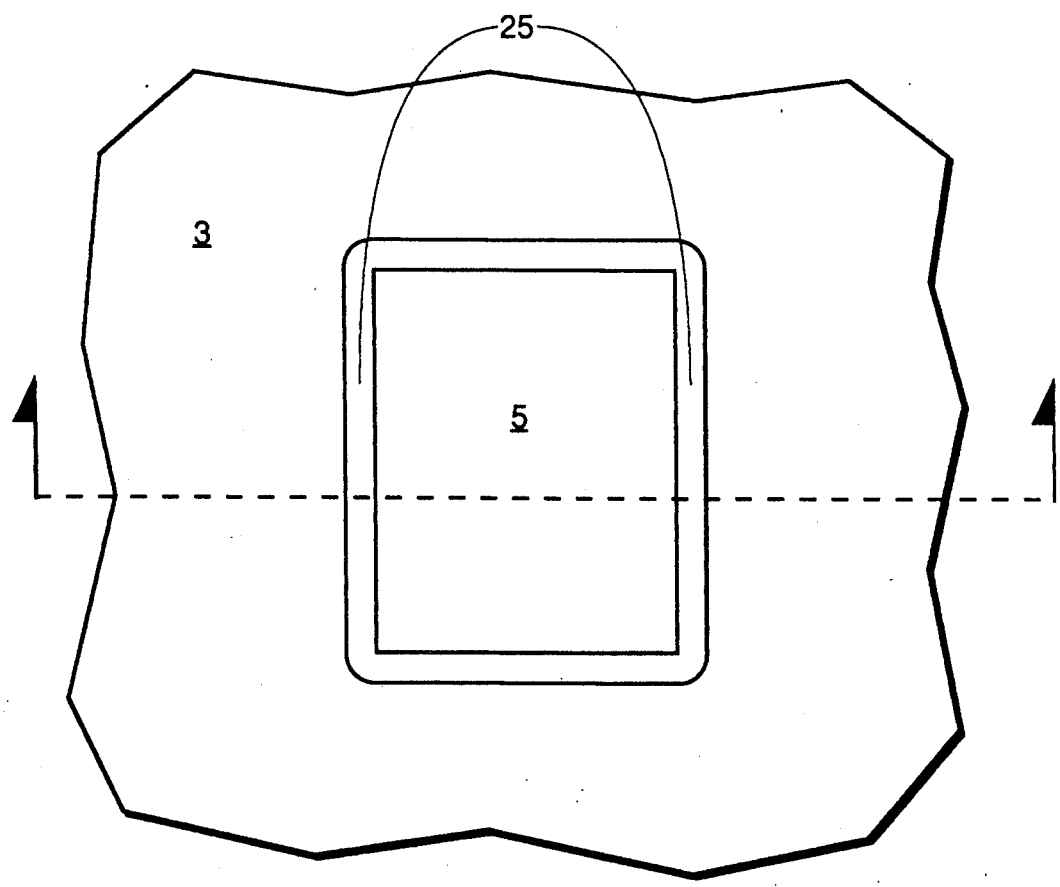

In FIGS. 23A and 23B, the nitride has been etched and the die is ready for further fabrication.

Figure 24A:
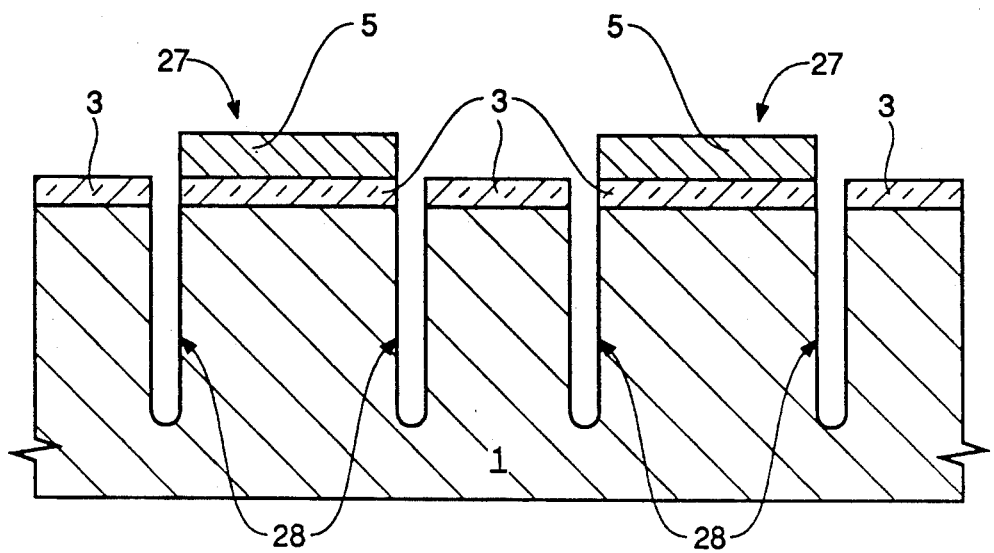
FIGS. 24A and 24B depict the trenches formed around two integrated circuit regions
Figure 24B:
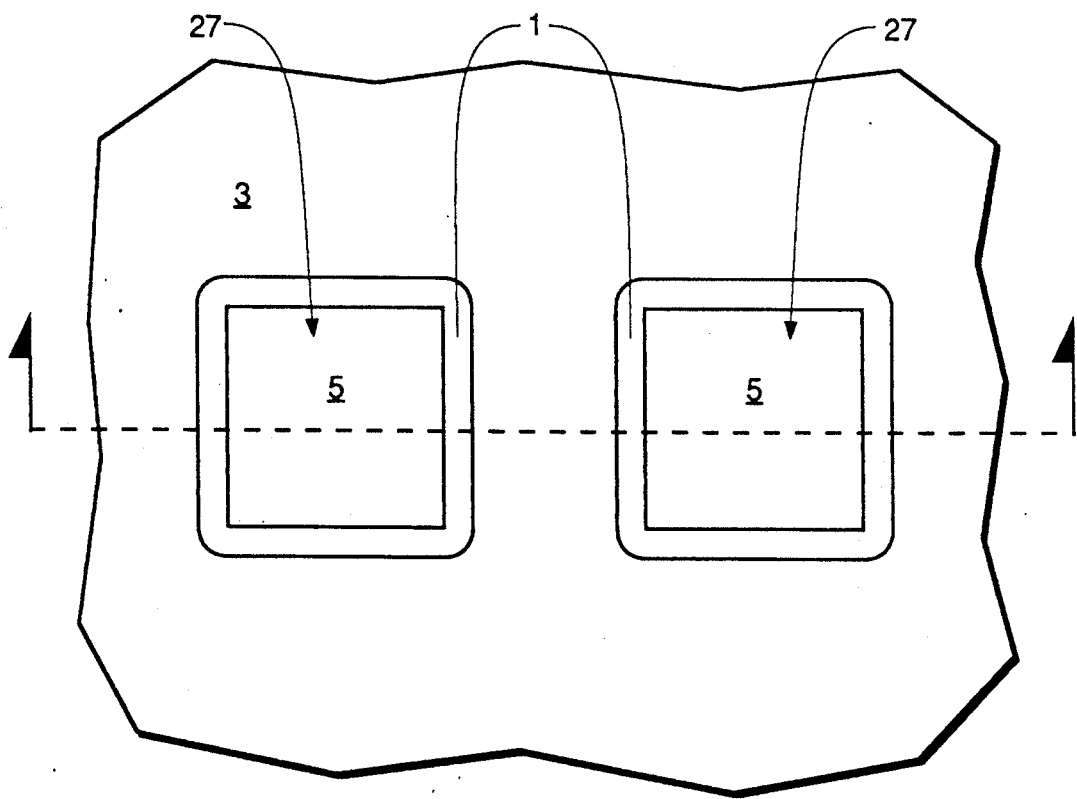
Figure 25A:
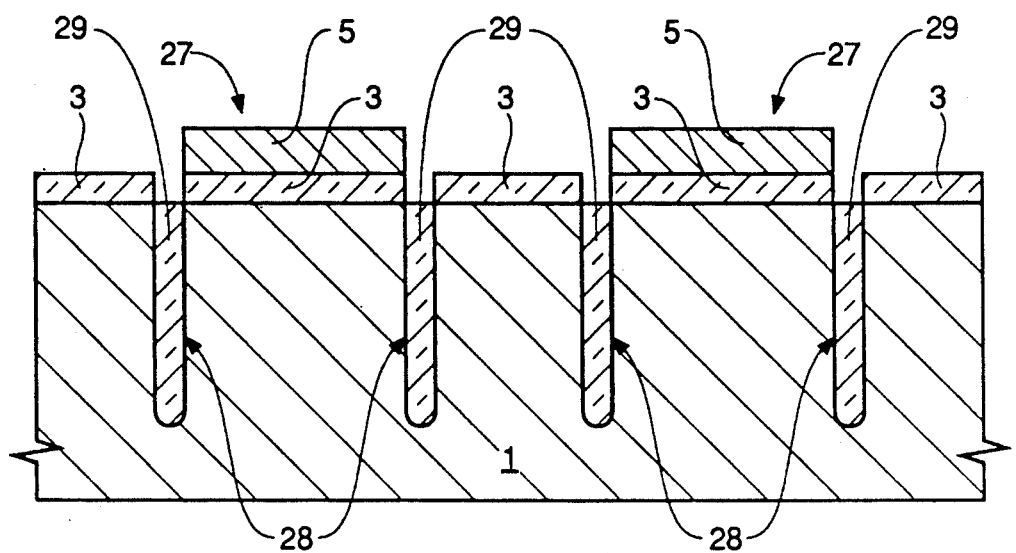
FIGS. 25A and 25B represent the in-process wafer portion of FIGS. 24A and 24B, respectively following the oxidation of the trenches.
Figure 25B:
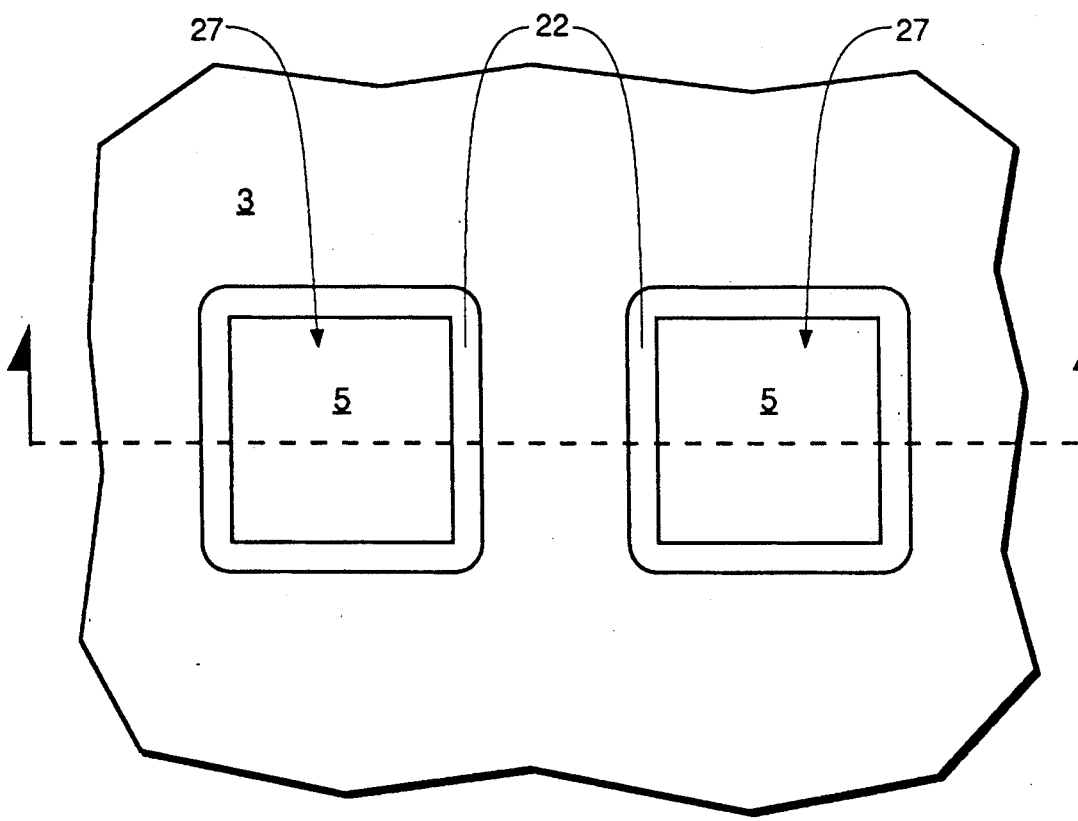

FIGS. 24A and 24B are a representation of trench fabrication around a plurality of mask islands 27. The process is essentially the same as fabricating trenches around one island. Trenching each island ensures each circuit region individual protection from latch up. FIGS. 25A and 25B depict the trenches 28 of the islands of FIG. 24 once they have been filled with oxide 29.

Although only several embodiments of the process have been described herein, it will be apparent to one of ordinary skill in the art, that changes may be made thereto without departing from the spirit and the scope of the process, as claimed.

I claim:

1. A process for creating an etch mask having an annular opening, said annular opening having a width that is less than the resolution limit of the employed photolithographic process, said process for creating comprising the following sequence of steps;
  (a) creation of a mask island on substrate, said island perimeter defining the inner perimeter of the annular opening;
  (b) blanket deposition of a spacer layer over the substrate and said island, the spacer layer being etchable with a significant degree of selectivity over said island, the spacer layer having a given thickness which substantially corresponds to a desired width of the annular opening;
  (c) blanket deposition of a protective layer over the spacer layer, the protective layer and the spacer layer being distinctly etchable with respect to each other;
  (d) planarization of the protective layer to a level at or below the top of the spacer layer to expose a portion of the spacer layer, the spacer layer at a distance from the island greater than said given thickness remaining covered by the protective layer; and
  (e) etching the exposed spacer layer to create said annular opening in said etch mask, said annular opening having an inner perimeter self aligned to the island perimeter and having an outer perimeter self aligned to the remaining protective layer and covered spacer layer, said annular ring having said desired width, and said etching exposing the substrate adjacent to the annular ring, the exposed substrate equal to said desired width.

2. The process of claim 1, wherein said creation of said mask island comprises the following sequence of steps:
  (a) depositing a base layer on the substrate;
  (b) patterning the base layer with photoresist; and
  (c) anisotropically etching the base layer to create an island.

3. The process of claim 1, wherein said creation of a mask island comprises the following sequence of steps:
  (a) oxidizing the substrate;
  (b) depositing a nitride layer on said oxidized substrate;
  (c) depositing a base layer on the nitride layer;
  (d) patterning the base layer with photoresist
  (e) a first anisotropic etching of the base layer according to said patterning;
  (f) a second anisotropic etching of the nitride layer according to said patterning, said first and second etchings creating a mask island of said nitride, said base layer, and oxidized substrate; and
  (g) reoxidizing the substrate.

4. The process of claim 3, wherein the substrate is exposed by overetching the reoxidized substrate after the spacer layer etching described in step (e) of claim 1.

5. The process of claim wherein planarization is accomplished by the following sequence of steps:
  (a) depositing a planarized layer of photoresist resin over said protective layer; and
  (b) etching of the photoresist resin layer and the protective layer.

6. The process of claim 5, wherein etching of the photoresist resin and the protective layer is accomplished with an isotropic plasma etch.

7. The process of claim 1, wherein the planarization is accomplished by a mechanical etch.

8. The process of claim 1 wherein said spacer layer is etched isotropically.

9. The process of claim 1 wherein the spacer layer is polysilicon.

10. The process of claim 1 wherein the protective layer is oxide.

11. The process of claim 2 wherein the base layer is silicon dioxide.

12. The process of claim 3 wherein the base layer is silicon dioxide.

13. The process of claim 1 wherein the polysilicon is deposited by LPCVD.

14. The process of claim 1 wherein oxidation is accomplished with elevated temperature.

15. The process of claim 1 wherein the nitride is deposited by LPCVD.

16. The process of claim 1 wherein the protective oxide layer is deposited by LPCVD.

17. The process of claim 1 wherein the protective oxide layer is deposited by TEOS.

18. The process of claim 1, further comprising
  (a) etching trenches in the exposed substrate;
  (b) etching away of said island after trench formation; and
  (c) oxidizing the trench.

19. The process of claim 18, wherein said trench etching is anisotropic.

20. The process of claim 18, wherein said island etching is isotropic.

21. The process of claim 18, wherein said said oxidation comprises thermally growing oxide from the sidewalls.

22. The process of claim 19, wherein said oxidation comprises depositing oxide in the trench.

* * * * *

UNITED STATES PATENT AND TRADEMARK OFFICE
CERTIFICATE OF CORRECTION

PATENT NO. : 5,047,117
DATED : September 10, 1991
INVENTOR(S) : Martin C. Roberts Page 1 of 3

It is certified that error appears in the above-indentified patent and that said Letters Patent is hereby corrected as shown below:

In the Abstract, line 13, delete "protection" and insert -- protective --.

In the Abstract, line 18, delete "definedd" and insert -- defined --.

Column 1, line 23, after "capability" insert -- . --.

Column 2, line 4, delete "nolog,y," and insert -- nology, --.

Column 3, line 3, delete "protection" and insert -- protective --.

Column 3, line 36, delete "; and" and insert -- . --.

Column 3, line 46, delete ";" and insert -- . --.

Column 3, line 49, delete ";" and insert -- . --.

Column 3, line marked as 53, delete ";" and insert -- . --.

Column 3, line marked as 61, delete "9A and 9B" and insert -- 10A and 10B --.

Column 4, line 5, delete "13A and 13B" and insert -- 14A and 14B --.

Column 4, line 11, delete "15A and 15B" and insert -- 16A and 16B --.

UNITED STATES PATENT AND TRADEMARK OFFICE
CERTIFICATE OF CORRECTION

PATENT NO. : 5,047,117

DATED : September 10, 1991

INVENTOR(S) : Martin C. Roberts

Page 2 of 3

It is certified that error appears in the above-indentified patent and that said Letters Patent is hereby corrected as shown below:

Column 4, line 27, delete "20A and 20B" and insert -- 21A and 21B --.

Column 4, line 47, after "flexible" delete -- , --.

Column 5, line 36, delete ", (TEOS)," and insert -- (TEOS) --.

Column 5, line 67, delete "masked" and insert -- mask --.

Column 7, line 3, delete ";" and insert -- : --.

Column 7, line 27, delete "self aligned" and insert -- self-aligned --.

UNITED STATES PATENT AND TRADEMARK OFFICE
CERTIFICATE OF CORRECTION

PATENT NO. : 5,047,117
DATED : September 10, 1991
INVENTOR(S) : Martin C. Roberts It is certified that error appears in the above-indentified patent and that said Letters Patent is hereby corrected as shown below:

Column 7, line 29, delete "self aligned" and insert -- self-aligned --.

Column 7, line 48, after "photoresist" insert -- ; --.

Column 8, line 7, after "claim" insert -- 1, --.

Column 8, line 38, after "comprising" insert -- : --.

Column 8, line 47, delete second "said".

Signed and Sealed this

Thirteenth Day of July, 1993

Attest:

MICHAEL K. KIRK

Attesting Officer

Acting Commissioner of Patents and Trademarks